(12) United States Patent
Saxena et al.

(10) Patent No.: US 12,170,254 B2
(45) Date of Patent: Dec. 17, 2024

(54) TRANSISTOR WITH INTEGRATED SHORT CIRCUIT PROTECTION

(71) Applicant: NXP USA, Inc., Austin, TX (US)

(72) Inventors: Tanuj Saxena, Chandler, AZ (US); John Pigott, Phoenix, AZ (US); Vishnu Khemka, Chandler, AZ (US); Ljubo Radic, Gilbert, AZ (US); Ganming Qin, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 116 days.

(21) Appl. No.: 17/935,032

(22) Filed: Sep. 23, 2022

(65) Prior Publication Data

US 2024/0113045 A1 Apr. 4, 2024

(51) Int. Cl.
*H01L 23/62* (2006.01)
*H03K 17/082* (2006.01)

(52) U.S. Cl.
CPC ......... *H01L 23/62* (2013.01); *H03K 17/0822* (2013.01); *H03K 2217/0027* (2013.01)

(58) Field of Classification Search
CPC ............. H01L 27/0248; H01L 27/0251; H01L 27/0255; H01L 23/62; H03K 2017/0806; H01H 4/04; H01H 4/042; H01H 4/044; H02H 9/02–028
See application file for complete search history.

(56) References Cited

U.S. PATENT DOCUMENTS

| 4,963,970 | A | 10/1990 | Throngnumchai et al. |
| 6,236,088 | B1 | 5/2001 | Nielson et al. |
| 8,503,146 | B1 | 8/2013 | Shekhawat |
| 8,900,983 | B1 | 12/2014 | Hebert |
| 9,160,165 | B2 | 10/2015 | Cortigiani et al. |
| 9,461,030 | B2 | 10/2016 | Nishimura |
| 9,608,617 | B2 | 3/2017 | Yasusaka |
| 9,979,187 | B2 | 5/2018 | Basler et al. |
| 2007/0004055 | A1* | 1/2007 | Ball ........................ H01L 23/34 257/E23.08 |
| 2015/0358013 | A1* | 12/2015 | Sakai ...................... H03K 17/14 327/109 |
| 2019/0043853 | A1 | 2/2019 | Osuga et al. |

(Continued)

FOREIGN PATENT DOCUMENTS

WO WO-2020172031 A1 8/2020

OTHER PUBLICATIONS

Bolotnikov, Alexander, et al; "Optimization of 1700 V SiC MOSFET for Short Circuit Reggedness"; Materials Science Forum, vol. 963; 4 pages (Jul. 19, 2019).

(Continued)

*Primary Examiner* — Jared Fureman
*Assistant Examiner* — Christopher J Clark

(57) ABSTRACT

A semiconductor device has first and second current terminals and a control terminal that can be biased to form an electrically conductive path from the first current terminal to the second current terminal through a channel region is provided with a temperature-sensitive current limiting device. The current-limiting device is integrally formed from semiconductor material of the control terminal and is configured to cause a reduction in electrical current flowing through the channel region when the temperature of the device in the channel region exceeds a predetermined threshold temperature.

17 Claims, 17 Drawing Sheets

(56) References Cited

U.S. PATENT DOCUMENTS

2020/0295748 A1* 9/2020 Lin .................... H01L 21/8249
2024/0068879 A1* 2/2024 Zhao ................... H01L 27/0248

OTHER PUBLICATIONS

Hatta, Hideyuki et al; "Suppression of Short-Circuit Current with Embedded Source Resistance in SiC-MOSFET"; Materials Science Forum, vol. 924; 4 pages (Jun. 5, 2018).
Kanale, Ajit et al; "A New User-Configurable Method to Improve Short-Circuit Ruggedness of 1.2-kV SiC Power MOSFETs"; IEEE Applied Power Electronics Conf. and Expo; 7 pages (2021).
Sadik, Diane Perle et al; "Short-Circuit Protection Circuits for Silicon-Carbide Power Transistors"; IEEE Trans. Ind Electron, vol. 63, No. 4; 10 pages (2016).
Wang, Zhiqiang et al; "Temperature-Dependent Short-Circuit Capability of Silicon Carbide Power MOSFETs"; IEEE Transactions On Power Electronics, vol. 31, No. 2; 12 pages (Feb. 2016).
Yin, Shan et al; "A digital-controlled gate charge detection circuit for short-circuit protection and condition monitoring of SiC MOSFET"; Wile, IET Power Electronics; 11 pages (Dec. 2, 2021).

* cited by examiner

TRANSISTOR WITH INTEGRATED SHORT CIRCUIT PROTECTION

FIELD OF THE INVENTION

Embodiments of the subject matter described herein relate to field-effect transistors and methods of fabrication of such transistors.

BACKGROUND OF THE INVENTION

Transistor-based circuits are used for applications that include amplification and switching. Specialized transistor circuits may be used in high power applications involving connecting and disconnecting a load from a high voltage source. In such applications a short circuit in the load or other large decreases in load resistance can result in high currents passing through a transistor coupled between the load and a power supply. Fuses and other protection devices are often used to protect the transistor and other circuitry from damage in the event of a short circuit event. When high-power transistor technologies using SiC are used in applications where high current densities are desirable, excess currents can result in rapid heating of devices and surrounding structures.

SUMMARY OF THE INVENTION

In an example embodiment, a semiconductor device includes a first current terminal, a second current terminal, a control terminal, and a temperature-sensitive current-limiting device. The first and second current terminals and the control terminal are jointly configured to provide an electrically conductive current path from the first current terminal to the second current terminal via a channel region when a suitable bias voltage of a first polarity is applied to the control terminal. The temperature-sensitive current-limiting device is integrally formed from semiconductor material of the control terminal and the current-limiting device is configured to cause a reduction in an amount of electrical current flowing from the first current terminal to the second current terminal when a temperature of the device within the channel region exceeds a predetermined temperature limit.

In another example embodiment a method includes forming, as part of a semiconductor device having a first current terminal, a second current terminal, and a control terminal, a temperature-sensitive current-limiting device. The current-limiting device is integrally formed from semiconductor material of the control terminal and the current-limiting device is configured to cause a reduction in an amount of electrical current flowing from the first current terminal to the second current terminal when a temperature of the device within the channel region exceeds a predetermined temperature limit.

In another example embodiment, a transistor includes a first current terminal operable as source terminal of the transistor; a second current terminal operable as a drain terminal of the transistor; a control terminal; elongated semiconducting source fingers coupled to the first current terminal; and elongated gate fingers in an interdigitated arrangement with the source fingers that are coupled to the control terminal. Each source finger includes a volume of a first semiconductor material doped to have a first electrical conductivity type and disposed within a surrounding volume of the first semiconductor material doped to have a second electrical conductivity type opposite the first electrical conductivity type.

Each gate finger includes an electrically conductive first gate finger layer. The first gate finger layer is disposed between two source fingers above the surrounding volumes of the first semiconductor material of those source fingers and above a drift region formed from the first semiconductor material doped to have the first electrical conductivity type and disposed between the surrounding volumes of the first semiconductor material of the two source fingers.

The first gate finger layer is separated from first semiconductor material of the surrounding volumes of the first semiconductor material and from the drift region by a first dielectric material; and the first gate finger layer is configured such that, when a first bias voltage having a first polarity is applied to the control terminal, an electrically conductive channel region is formed between the source fingers and a drain contact coupled to the second current terminal via the drift region.

Each gate finger is formed from a second semiconductor material and includes a temperature-sensitive current-limiting device integrally formed from the second semiconductor material of the that gate finger. Each current-limiting device is configured to cause a reduction in an amount of electrical current flowing from the first current terminal to the second current terminal when a temperature of the transistor within the channel region exceeds a predetermined temperature limit.

In another example embodiment a method includes forming, as part of a transistor, gate fingers that include temperature-sensitive current-limiting devices that are integrally formed from semiconductor material of the gate fingers.

The transistor includes a first current terminal; a second current terminal; a control terminal; elongated semiconducting source fingers coupled to the first current terminal; and elongated gate fingers in an interdigitated arrangement with the source fingers that are coupled to the control terminal. Each source finger includes a volume of a first semiconductor material doped to have a first electrical conductivity type and disposed within a surrounding volume of the first semiconductor material doped to have a second electrical conductivity type opposite the first electrical conductivity type.

Each gate finger includes an electrically conductive first gate finger layer. The first gate finger layer is disposed between two source fingers above the surrounding volumes of the first semiconductor material of those source fingers and above a drift region formed from the first semiconductor material doped to have the first electrical conductivity type and disposed between the surrounding volumes of the first semiconductor material of the two source fingers.

The first gate finger layer is separated from first semiconductor material of the surrounding volumes of the first semiconductor material and from the drift region by a first dielectric material; and the first gate finger layer is configured such that, when a first bias voltage having a first polarity is applied to the control terminal, an electrically conductive channel region is formed between the source fingers and the drain contact via the drift region.

The current-limiting device of each gate finger is configured to cause a reduction in an amount of electrical current flowing from the first current terminal to the second current terminal when a temperature of the transistor within the channel region exceeds a predetermined temperature limit.

BRIEF DESCRIPTION OF THE SEVERAL VIEWS OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1A:
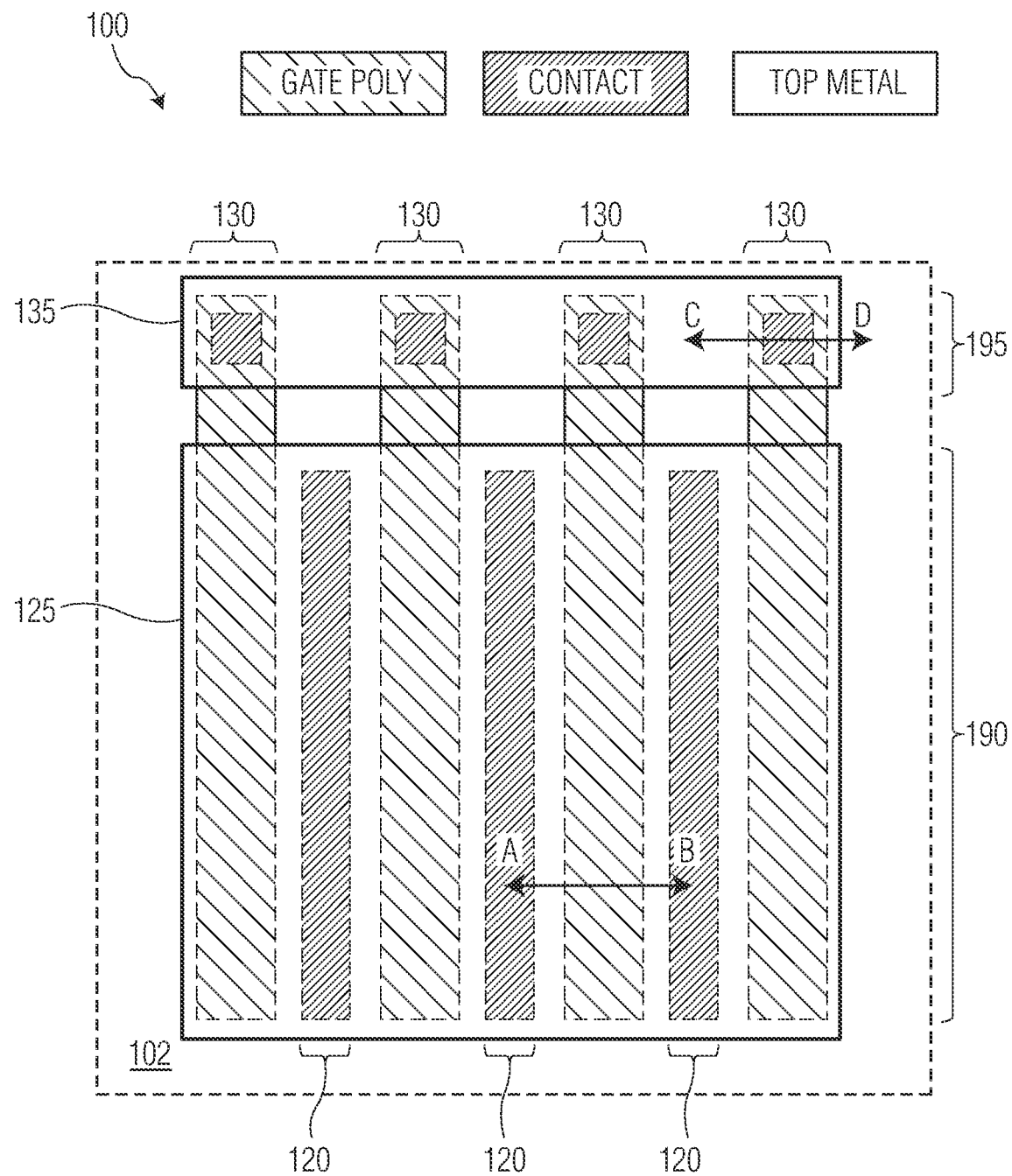
FIG. 1A is a plan view of a transistor having features which may be modified to incorporate embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

Directional references such as "top," "bottom," "left," "right," "above," "below," and so forth, unless otherwise stated, are not intended to require any preferred orientation, and are made with reference to the orientation of the corresponding figure or figures for purposes of illustration.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical (including, but not limited to, direct electrical coupling, capacitive coupling, and/or inductive coupling) or in a non-electrical manner. As used herein the terms "substantial" and "substantially" mean sufficient to accomplish the stated purpose in a practical manner and that minor imperfections, if any, are not significant for the stated purpose.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Previous approaches to protecting transistors from performance degradation and damage from excess current include using sensing and feedback circuitry to detect an excess current event and bias the transistor gate(s) to reduce the current flowing through the device; tuning device dimensions to reduce the maximum channel current; adding additional source resistance; and/or introducing additional active circuit components at the source to reduce the effective gate bias when a short circuit condition is present. Unfortunately, these and related approaches have disadvantages which can include reduced device performance (e.g., increased on-state resistance and power dissipation); increased circuit complexity; and increased design and manufacturing costs. Accordingly, embodiments herein provide devices and methods for providing transistors with protection against excess currents ("excess current events" or "short circuits") while addressing shortcomings of previous devices and methods.

Figures 1B, 1C:
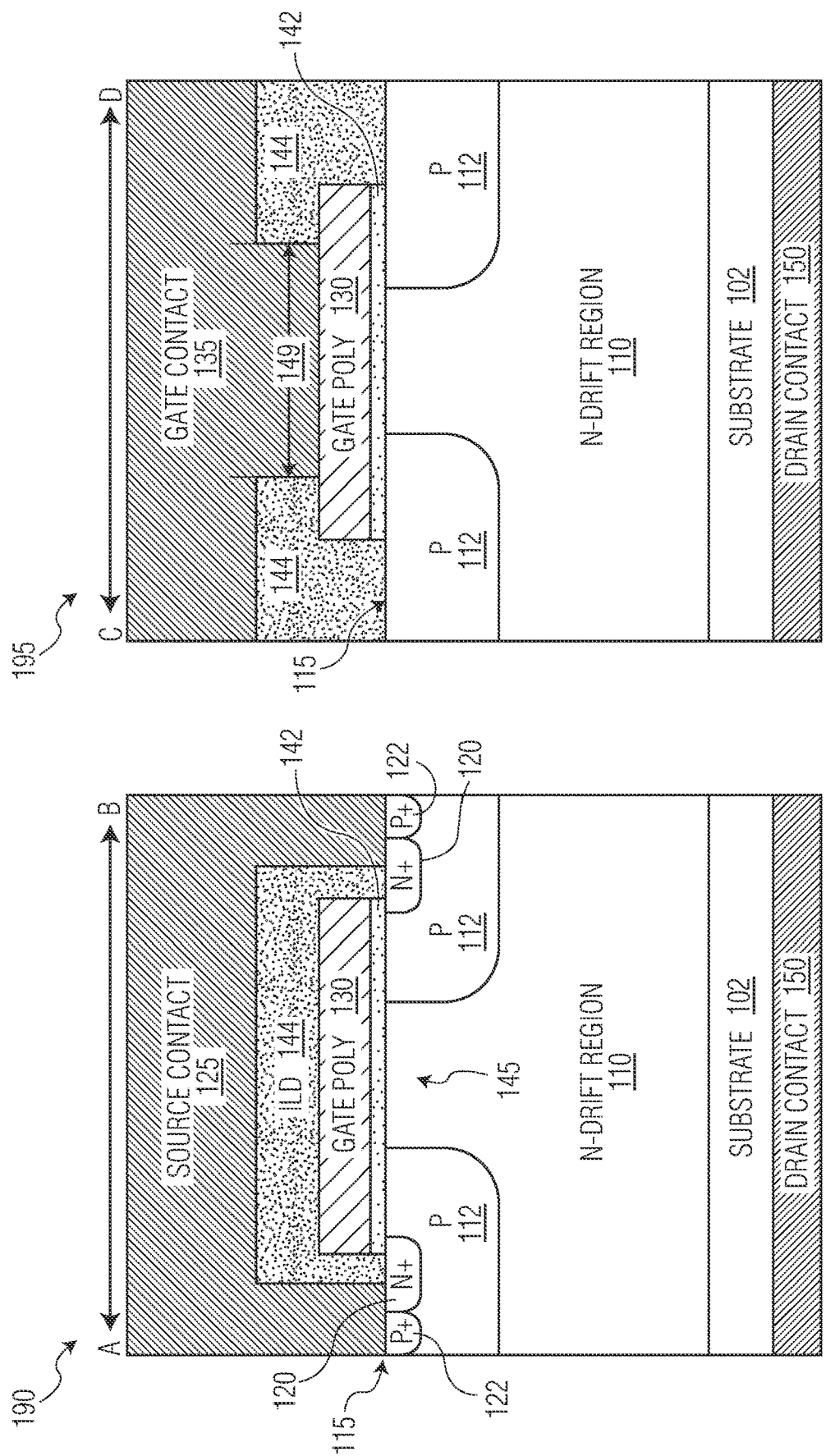
FIG. 1B is a transverse cross-sectional view across two source fingers and a gate finger in a source contact area of the transistor of FIG. 1A.
FIG. 1C is a transverse cross-sectional view across two source fingers and a gate finger in a gate contact area of the transistor of FIG. 1A.

FIGS. 1A, 1B, and 1C collectively depict features of an example transistor according to previous approaches which may be modified according to embodiments herein, as described below in connection with FIGS. 2A-2B, 3A-3B, 4A-4D, 5A-5B, and 6A-6B. The transistor 100 is a vertical metal-oxide semiconductor field-effect transistor (MOSFET) often referred to as a double-diffused MOSFET, or as a DMOS FET) for purposes of illustration and will be understood that nothing herein is intended to limit applications of embodiments herein to such structures.

FIG. 1A is a schematic plan-view of the transistor 100 formed on a substrate 102. The transistor 100 has a first current terminal (formed at least in part by one or more source fingers 120 in the example of FIG. 1A), a second current terminal (formed at least in part a drain contact or one or more drain fingers in this example, not shown in FIG. 1A), and a control terminal (formed at least in part by one or more gate fingers 130 in this example). As shown, the transistor 100 may include a source contact 125 in a source contact area 190 (i.e., active areas of the transistor 100 in which the source fingers 120 and gate fingers 130 are both present and one or more conductive channels between source and drain are formed when transistor is biased in the cony state; i.e., when the bias voltage applied to the gate contact 135 meets or exceeds the threshold bias voltage for the gate of the transistor). The source contact 125 contacts one or more source fingers 120. A gate contact 135 contacts multiple gate fingers 130 in a gate contact area 195 (i.e., an area where the source fingers 120 are absent) through vias or other electrical contacts indicated by hatched areas underneath the gate contact 135. FIGS. 1B and 1C are schematic cross-sectional views of the transistor 100 in the source contact area 190 and the gate contact area 195, respectively. In the view of FIG. 1A, the source fingers 120 are disposed beneath the source contact 125.

FIG. 1B is a cross-sectional schematic of the transistor 100 in the source contact area 190, along the line A-B of FIG. 1A. In this view, two source fingers 120 (in this example, volumes of semiconductor material with n-type doping that are elongated in a direction parallel to the top surface 115) are disposed within larger volumes of semiconductor material that are oppositely doped (p-type wells 112). The p-type wells 112 are in turn surrounded by an n-type drift region 110 that is disposed between the p-type wells 112. Also shown are contact wells 122, which in this example, are p+ regions that are doped sufficiently to provide a low-resistance contact to the source fingers 120. It will be appreciated that, in one or more embodiments herein, similar contact wells are employed but that for simplicity, such features may not be explicitly shown in the figures or explicitly described.

In this example, the substrate 102 is an n-type wafer and a drain region is defined by the drain contact 150 on the back of the substrate 102. Gate fingers 130 (i.e., gate electrodes) are disposed above the drift region 110 at a top surface 115 of the device above the portion of the drift region 110 at the top surface 115 and separated from the drift region 110 and the source fingers 120 by a gate dielectric 142. The drift region 110 may be formed by doping a portion of the substrate 102 or may be formed by depositing or otherwise forming additional semiconductor material on the substrate 102 (e.g., via any suitable techniques including epitaxial growth techniques). When a suitable bias voltage is applied to a gate finger 130, an electrically conductive path is formed in the channel region 145 between the source fingers 120 and the drain contact 150. The gate fingers 130 are isolated from the source contact 125 in the source contact area 190 by an interlayer dielectric 144.

FIG. 1C is a cross-sectional schematic of the transistor 100 in the gate contact area 195 along the line C-D visible in FIG. 1A. In this cross-sectional view, a gate finger 130 is exposed through an aperture 149 in the interlayer dielectric 144 and electrically coupled to the gate contact 135 through the aperture.

It will be appreciated that although transistors such as the transistor 100 are described herein as n-p-n ("n-channel") transistors, that nothing herein is intended to limit embodiments so such transistors and that, in or more embodiments, doping polarities are reversed to provide a p-n-p ("p-channel") transistor. It will be further understood that any suitable doping configurations may be employed including configurations in which doped and undoped regions pictured are omitted or altered and configurations in which additional doped or undoped regions are added.

Vertical transistors such as the transistor 100 are often used in high power applications. In some such applications III-IV materials or other wide bandgap materials such as silicon carbide or diamond are used as the substrate 102 (or are formed on the substrate 102) to allow for higher current densities and higher blocking voltages than are typically possible in silicon devices. In high power applications such transistors may be operated with source-drain voltages (Vas) on the order of many hundreds of volts or higher and may be used to selectively switch high voltage loads such as motors and the like.

However, motors and other devices may be susceptible to failure modes in which the load becomes shorted, leading to high currents passing through a transistor switch together with high source-drain voltages (Vas). Sudden reductions in load resistance may in turn produce large increases in current carried by the transistor which may in turn lead to excessive heating and destructive device failures, particular when both the current through the device and Vas are large due to the high dissipated power. During short circuit events, it is desirable for high-power transistors to have an on-state resistance that is sufficiently high to limit current densities to levels that will reduce the likelihood of destructive device failure. However, in order to provide high energy efficiency and fast switching times, it is often desirable for power transistors to have low on-state channel resistance. As a result, power transistors are often designed to have low on-state resistances and additional protection elements are added to protect against excessive currents. However, these protection elements lead to degraded device performance or other undesirable characteristics like increased circuit areas and added circuit complexity.

Accordingly, in embodiments herein, one or more additional circuit elements are incorporated into a transistor to provide protection against short circuits. Because short circuits (or other excess current events) can result in rapid heating of a transistor channel, a temperature sensitive element can be used to detect a short circuit current by proxy. If voltage across such a circuit element also has a suitable temperature-dependent transfer function, it can be integrated with the transistor gate to reduce the gate bias, thereby reducing the current passing through the transistor channel or even turning the transistor off (i.e., by reducing the effective gate bias below the threshold voltage of the transistor).

Figure 2A:
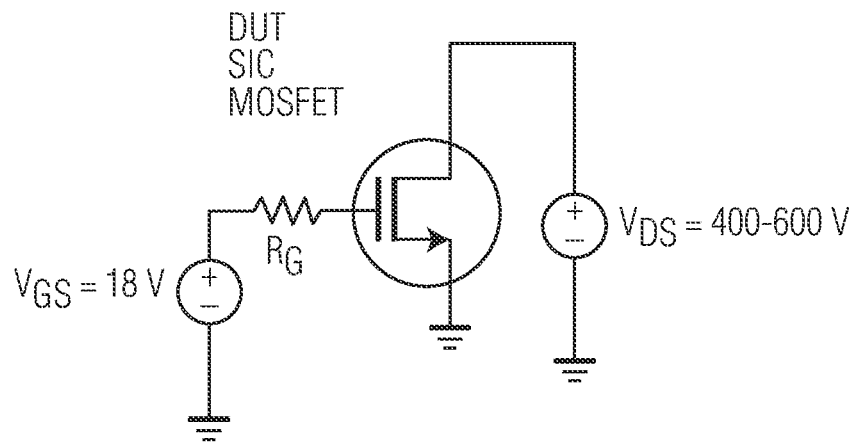
FIG. 2A is circuit diagram of an example transistor circuit in which embodiments herein may be incorporated.

FIG. 2A is a circuit diagram of a representative SiC power MOSFET in which the drain connection is shorted to a supply voltage terminal In the scenario depicted, the gate bias ($V_{GS}$) is ~18 Volts and the drain-to-source bias may be ~400-600 Volts and the transistor is operating in the saturation regime. The current passing through the channel of such a device at saturation is given by $$I_{D,SAT} = \mu_{ch} C_{ox} \frac{W}{L} \frac{(V_{GS} - V_t)^2}{2},$$

where $\mu_{ch}$ is the channel mobility, $C_{ox}$ is the gate capacitance, $V_t$ is the threshold voltage and W, L are the width and length of the channel. Thus, at a fixed value of $V_{GS}$, the saturation current depends only on the dimensions of the device and the material properties. As a result, the only parameter which can be used to reduce the channel current is reducing the gate bias.

Figure 2B:
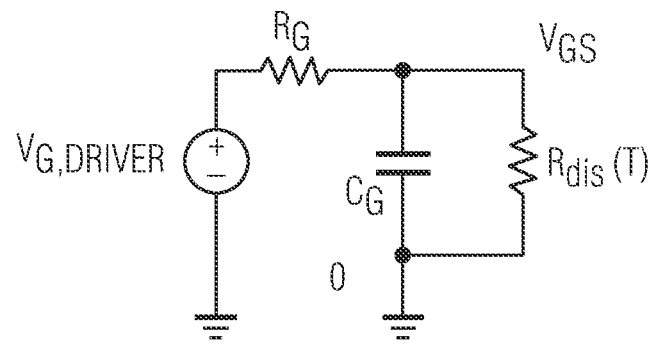
FIG. 2B is a circuit diagram illustrating desirable features of embodiments herein.
Figure 2C:
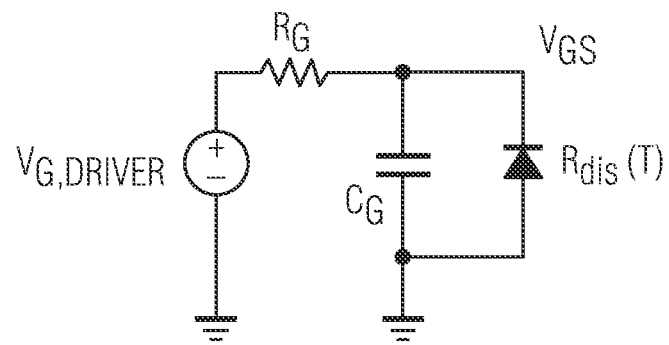
FIG. 2C is a circuit diagram further illustrating desirable features of embodiments herein.

FIG. 2B and FIG. 2C are equivalent circuit diagrams illustrating features of short circuit protection devices according to embodiments herein. FIG. 2A shows a voltage source coupled to a resistance ($R_G$), representing the gate resistance of a transistor driving a capacitance ($C_{GS}$) representing the gate-to-source capacitance of the transistor, producing a gate bias voltage ($V_{GS}$). A temperature-dependent parasitic resistance has the effect of dividing the potential difference across the voltage supply source between the gate resistance and the parasitic resistance, which can be used to at least partially discharge the gate capacitance, when this "discharge" resistance ($R_{DIS}$) is suitably small compared to $R_G$. It is desirable that $R_{DIS} \gg R_G$ when the transistor is operated within its specification limits, but that $R_G$ begins to decrease appreciably when the temperature rises beyond a desired specification limit in the transistor channel. One way this can be accomplished is with a diode having a suitable current-voltage characteristic when it is reverse biased, as depicted in FIG. 2B, in which the discharge resistance RD/S is provided by reverse-biased diode. For semiconductor diodes, the reverse leakage current below breakdown is typically an exponential function of temperature and the activation energy which depends on the electronic bandgap of the material. Thus, diode structures can be employed, according to embodiments herein, to form current protection devices that respond to heating induced by short circuits or other excess current events. In embodiments herein, such structures can be formed within a transistor such that the heating they are exposed to is similar to the current-induced heating of the transistor itself.

Figure 3A:
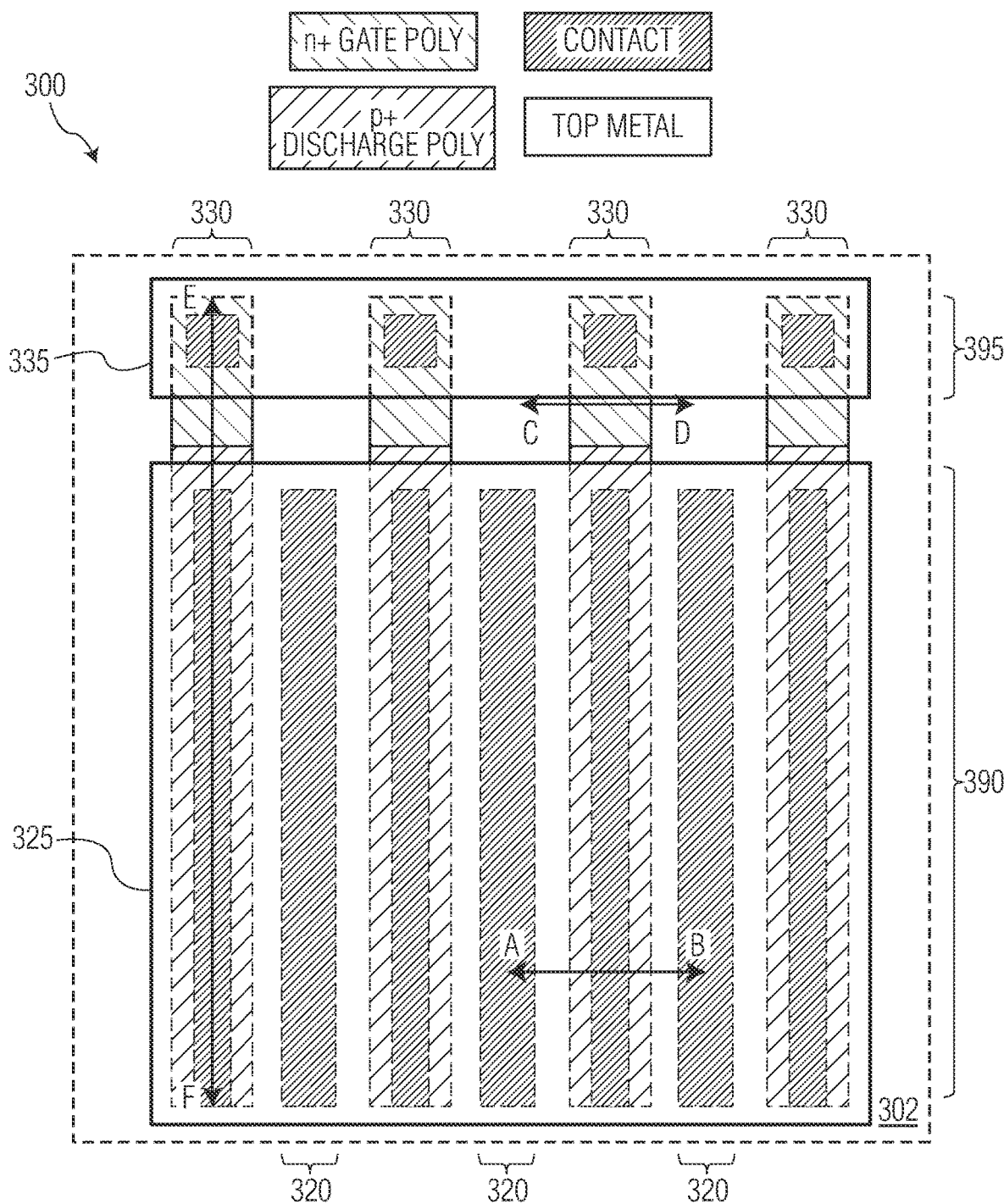
FIG. 3A is a plan view of a transistor according to embodiments herein.
Figure 3B:
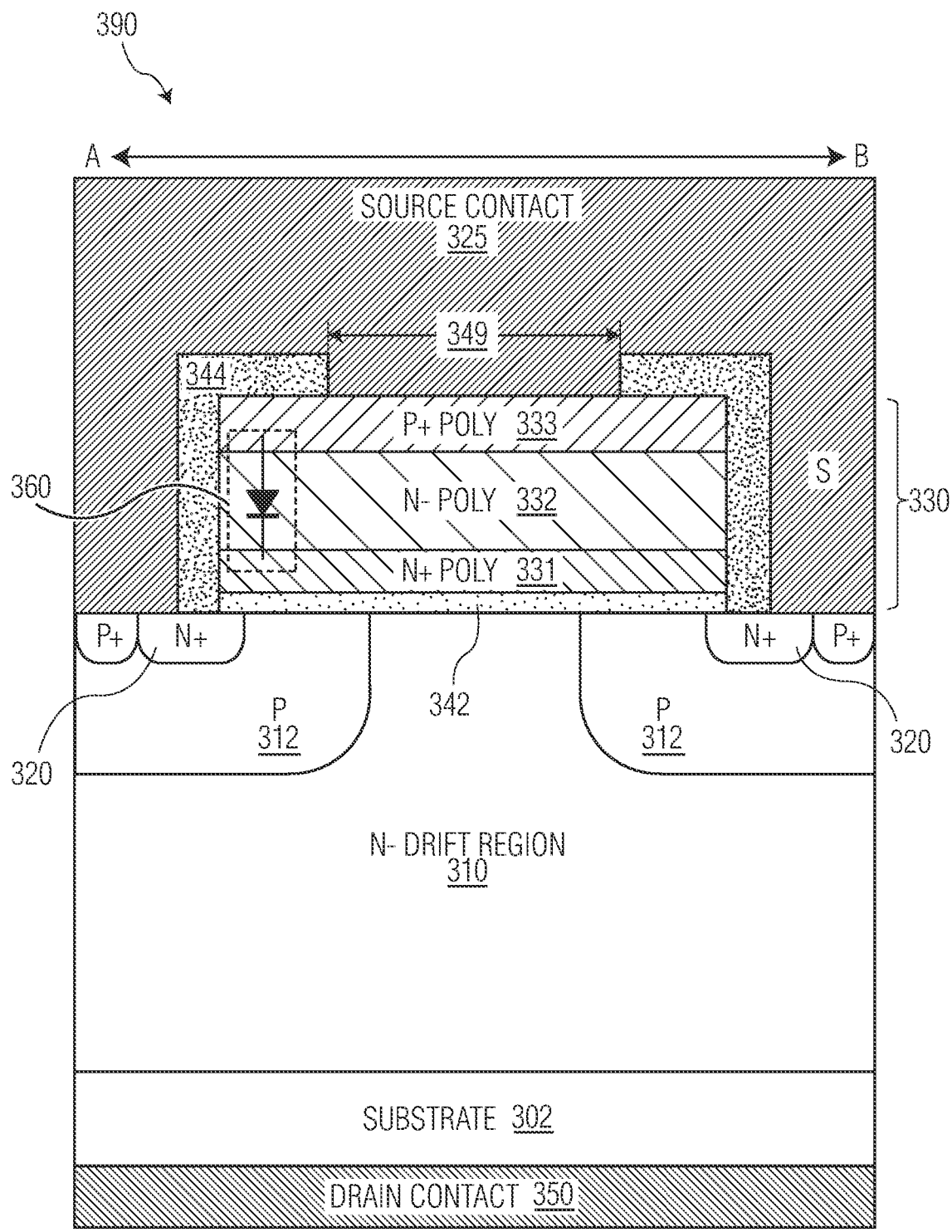
FIG. 3B a transverse cross-sectional view across two source fingers and a gate finger in a source contact area of the transistor of FIG. 3A.
Figure 3C:
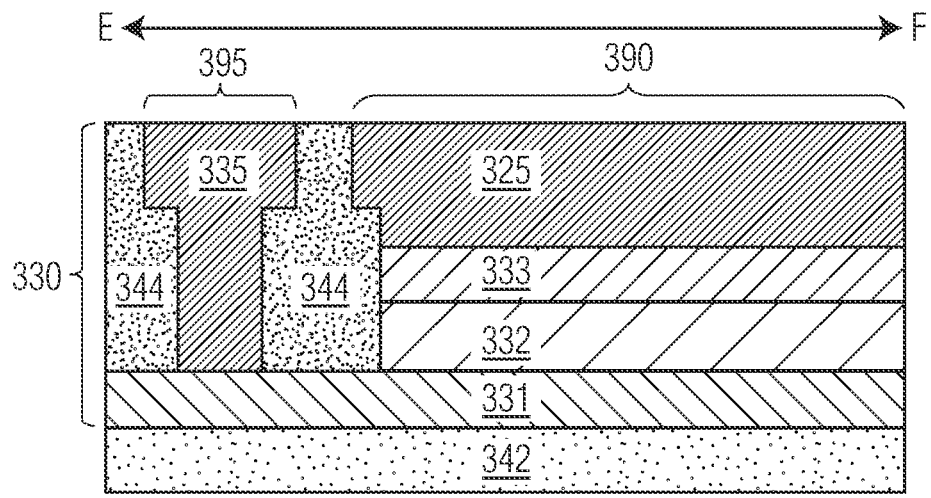
FIG. 3C is a lengthwise cross-sectional view of a gate finger of the transistor of FIG. 3A according to one or more embodiments.

FIGS. 3A, 3B, and 3C collectively depict features of an example transistor similar to the transistor 100 that is modified according to embodiment herein. The transistor 300 is a DMOS FET for purposes of illustration and will be understood that nothing herein is intended to limit applications of embodiments herein to such structures.

FIG. 3A is a schematic plan-view of the transistor 300 formed on a substrate 302 (e.g., a substrate 102). The transistor 300 has a first current terminal (formed at least in part by one or more source fingers 320 as shown), a second current terminal (formed at least in part a drain contact or one or more drain fingers, not shown in FIG. 3A), and a control terminal (formed at least in part by one or more gate fingers 330). As shown, the transistor 300 may include a source contact 325 in a source contact area 390 (i.e., an area in which the source fingers 320 and gate fingers 330 are both present) that contacts one or more source fingers 320 and a gate contact 335 that contacts multiple gate fingers 330 in a gate contact area 395 (i.e., an area where the source fingers 320 are absent) through vias or other electrical contacts indicated by hatched areas underneath the gate contact 335.

FIGS. 3B and 3C are schematic cross-sectional views of the transistor 300 in the source contact area 390 and the gate contact area 395, respectively.

The transistor 300 differs from the transistor 100 primarily in the source contact area 390. FIG. 3B is a cross-sectional schematic of the transistor 300 in the source contact area 390, along the line A-B of FIG. 3A (see also the line A-B of FIG. 1A). In this view, two gate fingers 330 (i.e., volumes of semiconductor material with n-type doping) are disposed within and surrounded by p-type wells 312 (e.g., p-type well 112), which are in turn surrounded by an n-type drift region 310 (e.g., a drift region 110) disposed between the p-type wells 312. In this example, the substrate 302 is an n-type wafer and a drain region is defined by the drain contact 350 (e.g., a drain contact 150) on the back of the substrate 102. Multilayer gate fingers 330 which include a first layer 331 forming a gate electrode) are disposed above the drift region 310 at a top surface 315 of the device above the portion of the drift region 310 at the top surface 115 and separated from the drift region 310 and the source wells 320 by a gate dielectric 342 (e.g., a gate dielectric 142).

The first layer of the gate finger 330 is configured for use as a gate electrode. When a suitable bias voltage is applied to the first gate finger layer of a gate finger 330 via the gate contact 325, an electrically conductive path is formed in the channel region 345 between the source fingers 320 adjacent to that gate finger 330 and the drain contact 350. In contrast to the gate fingers 130, the gate fingers 330 are not fully isolated from the source contact 325 in the source contact area 390. Instead, the gate fingers 330 in the source contact area 390 include a first n-type gate finger layer 331 (e.g., the single n-type layer of a gate finger 130) disposed above the gate dielectric 342 and additional layers (a second n-type gate finger layer 332 which is lightly doped and a p-type gate finger layer 333 in direct contact with the source contact 325 and the and the n-type gate finger layer 332).

It will be appreciated that, in this example, an electrically rectifying connection is formed between the first gate finger layer 331 and the top gate finger layer 333 (by way of the n-type gate layer 332). Thus, the three layers of the gate fingers 330 shown form a reverse biased diode structure 360 (indicated by a dashed diode circuit symbol) when the gate fingers 330 are biased with a gate bias voltage $V_{GS} > 0$. The dielectric material 344 insulates the gate fingers 330 from the source fingers 320, but the source contact 325 contacts the gate fingers 330 through apertures 349 in the dielectric material 344.

It will be further appreciated that the rectifying structures depicted and described herein are for the purposes of illustration and that nothing herein is intended to limit embodiments to a specific number or arrangement of semiconducting or other layers.

The configuration and material properties of the gate fingers 330 and other portions of the transistor 300 can be chosen to obtain desired protection characteristics. As example, the source fingers 320 and other doped regions formed on or within the substrate 302 may be formed from silicon carbide, with a semiconductor bandgap of ~3.3 eV, for example, or any other suitable semiconductor material in order to obtain desired characteristics including, switching speeds, high-temperature operation, desired power handling, high breakdown voltage, and the like. Meanwhile, the gate fingers 330 may be formed from a material with a lower bandgap that is compatible with the materials of the substrate 302. For example, as illustrated, the layers of the gate fingers 330 may be formed from polysilicon with a bandgap of ~1.1 eV. As a result, as the channel of the transistor experiences heating during a short circuit or other excessive current event, the reverse leakage current passing through the diode structure 360 will begin to increase exponentially with increasing temperature. This in turn results in a decreasing voltage across the diode structure 360 that reduces the effective $V_{GS}$ applied at the gate fingers 330, thereby reducing the excessive current passing through the channel of the transistor 300. When the layers of a gate finger 330 have a significantly smaller bandgap than the bulk of the device (as with polysilicon gate fingers in a silicon-carbide based device), the current limiting elements can begin to respond to temperature increases even before the current handling capability of the transistor is noticeably altered by the same temperature increases (e.g., before the channel resistance of the transistor is significantly increased).

The gate contact area 395 may be substantially similar or identical to the gate contact area 195 of the transistor 100. That is, the gate finger 330 in the gate contact area 395 may include only the n-type layer 331 in direct contact with the gate contact 335 (e.g., the gate contact 135).

FIG. 3C is a lengthwise cross-sectional view of a gate finger 330 along the line E-F of FIG. 3A showing the structure of the gate finger 330. In the gate contact area 395, only the first gate finger layer (the n-type layer 331) is present. The first gate finger layer is configured for use as a gate electrode and is directly contacted by the gate contact 335. In one or more embodiments, the gate contact 335 is electrically isolated from the source contact 325 by the interlayer dielectric 344 as shown. Meanwhile, the full stack of the gate finger 330 is present in the source contact area 390 in which a rectifying junction exists between the first gate finger layer (the n-type layer 331) and the top gate finger layer (the p-type layer 333). In one or more embodiments the rectifying junction includes an intermediate layer such as the n-type layer 332, while in one or more other embodiments, the rectifying junction may be abrupt or graded, or be formed by another suitable arrangement of semiconducting or other materials.

Figure 3D:
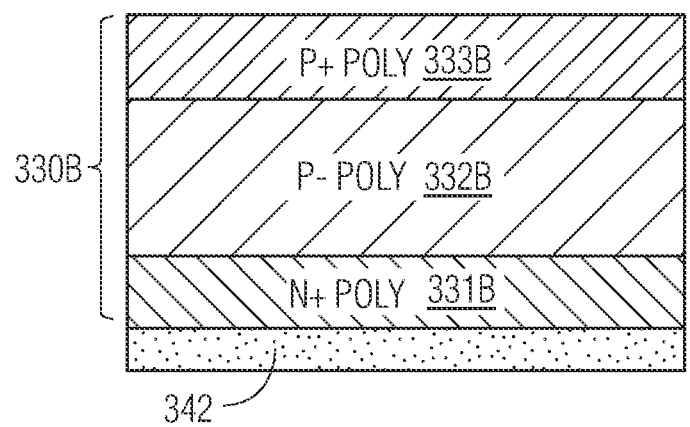
FIG. 3D is a cross-sectional view of alternative gate stack of the transistor of FIG. 3A according to one or more embodiments.

FIG. 3D depicts an alternate gate stack 330B which may be substituted for the gate fingers 330 in the source contact area 390 in one or more embodiments, The gate stack 330B includes an n+ polysilicon layer 331B (e.g., the n-type layer 331) immediately above the gate dielectric 342, and a p+ layer 333 in direct contact with the source contact 325. However, the middle layer is a lightly-doped p-type layer 332B rather than a lightly-doped n-type layer such as the n-type layer 332. As above, in one or more embodiments, one or more p-n-p transistors are used rather than one or more n-p-n transistors. In such embodiments, a n+/n–/p+ gate structure (from top to bottom) may be used as gate finger instead of the gate finger 330 or a n+/p/p+ gate structure may be used as a gate finger instead of the gate stack 330B. It will be further appreciated that, in or more embodiments, the gate finger 330 in the source contact area 390 forms a p-i-n diode structure (i.e., the middle layer of the gate fingers 330 is undoped or intrinsically doped), Similarly, in one or more embodiments that include the gate stack 330B, the middle layer of the gate stack 330B is undoped or intrinsically doped.

Simulations of transistors similar to the transistor 300 in which the substrate (e.g., a substrate 302) is a silicon carbide device substrate and the gate fingers are polysilicon as shown in FIG. 3A have been performed. In a short-circuit scenario in which a drain-to-source voltage ($V_{DS}$) of 400V and a gate bias voltage ($V_{GS}$) of 12V was supplied by a gate driver circuit with a 1 kΩ gate, diode structures similar to the diode structure 360 formed in the gate fingers 330 enabled the transistor to shut off within several microseconds of short-circuit induced heating of the transistor channel beneath the gate fingers, thereby preventing device failures.

In some applications, it is desirable to apply a negative gate bias ($V_{GS}<0V$) to a transistor such as the transistor 300 to ensure the transistor is in an 'off' state. However, in such applications, this can forward bias the diode structure 360 and result in undesired forward current through the diode which will cause undesired reduction of the magnitude of the applied gate bias voltage, which in turn can result in undesirable power dissipation when the device is intended to be in the 'off' state. Thus, in or more embodiments, one or more additional diode structures may be added in a back-to-back configuration with a diode structure such as the diode structure 360. An example transistor according to one or more such embodiments is described below in connection with FIGS. 4A, 4B, and 4C.

Figure 4A:
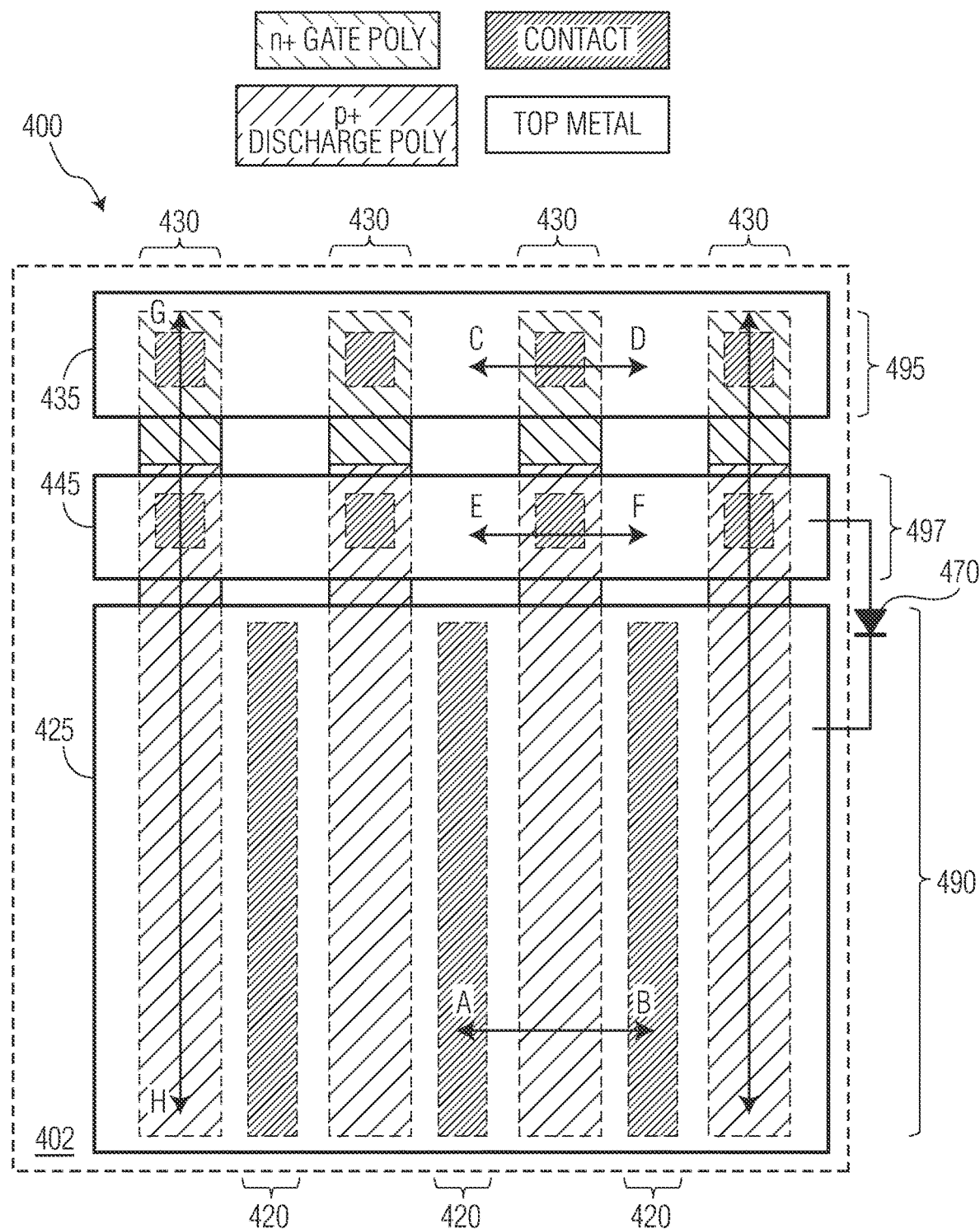
FIG. 4A is a plan view of another transistor according to embodiments herein.
Figure 4B:
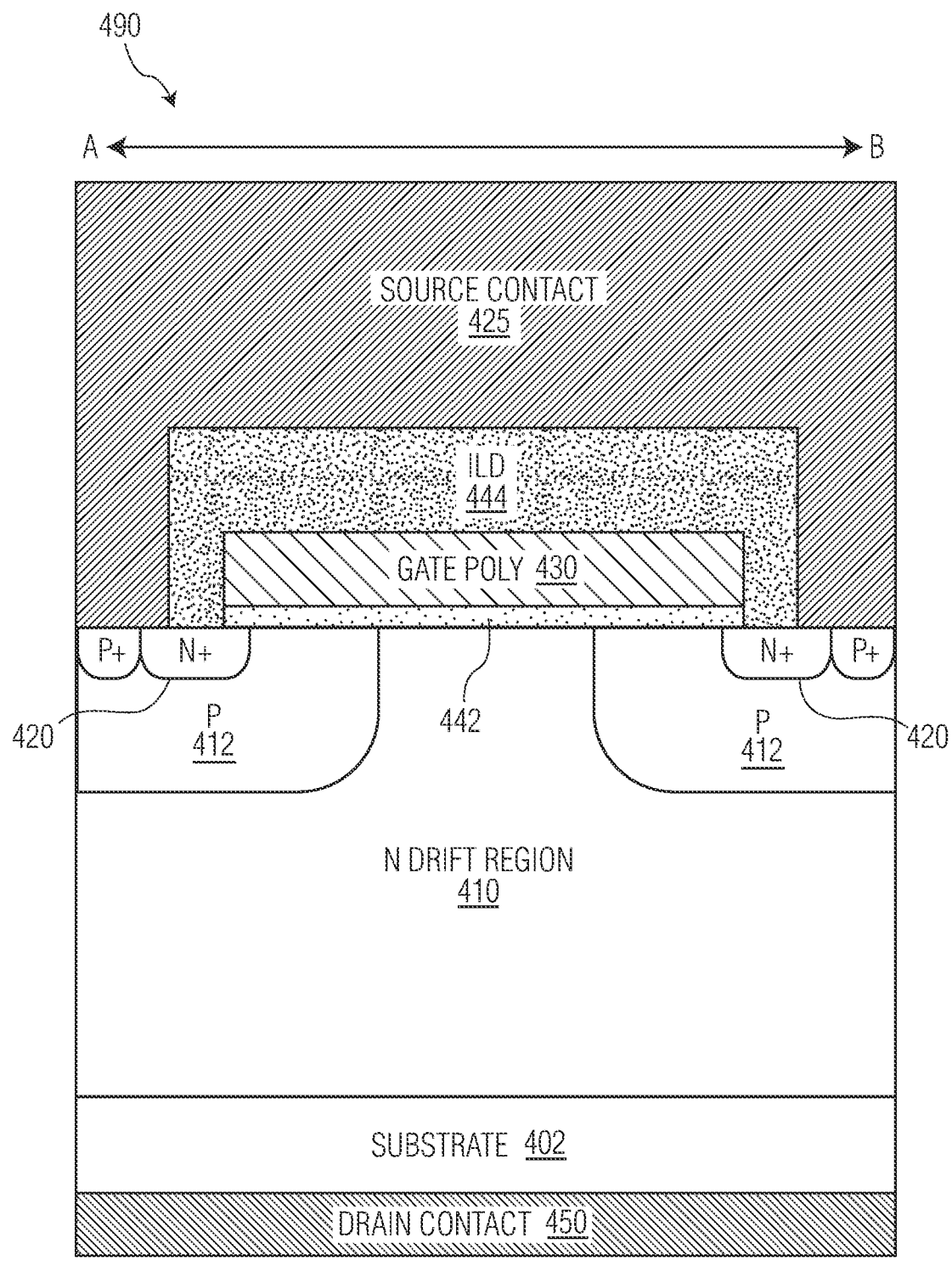
FIG. 4B is a transverse cross-sectional view across two source fingers and a gate finger in a source contact area of the transistor of FIG. 1A.
Figure 4C:
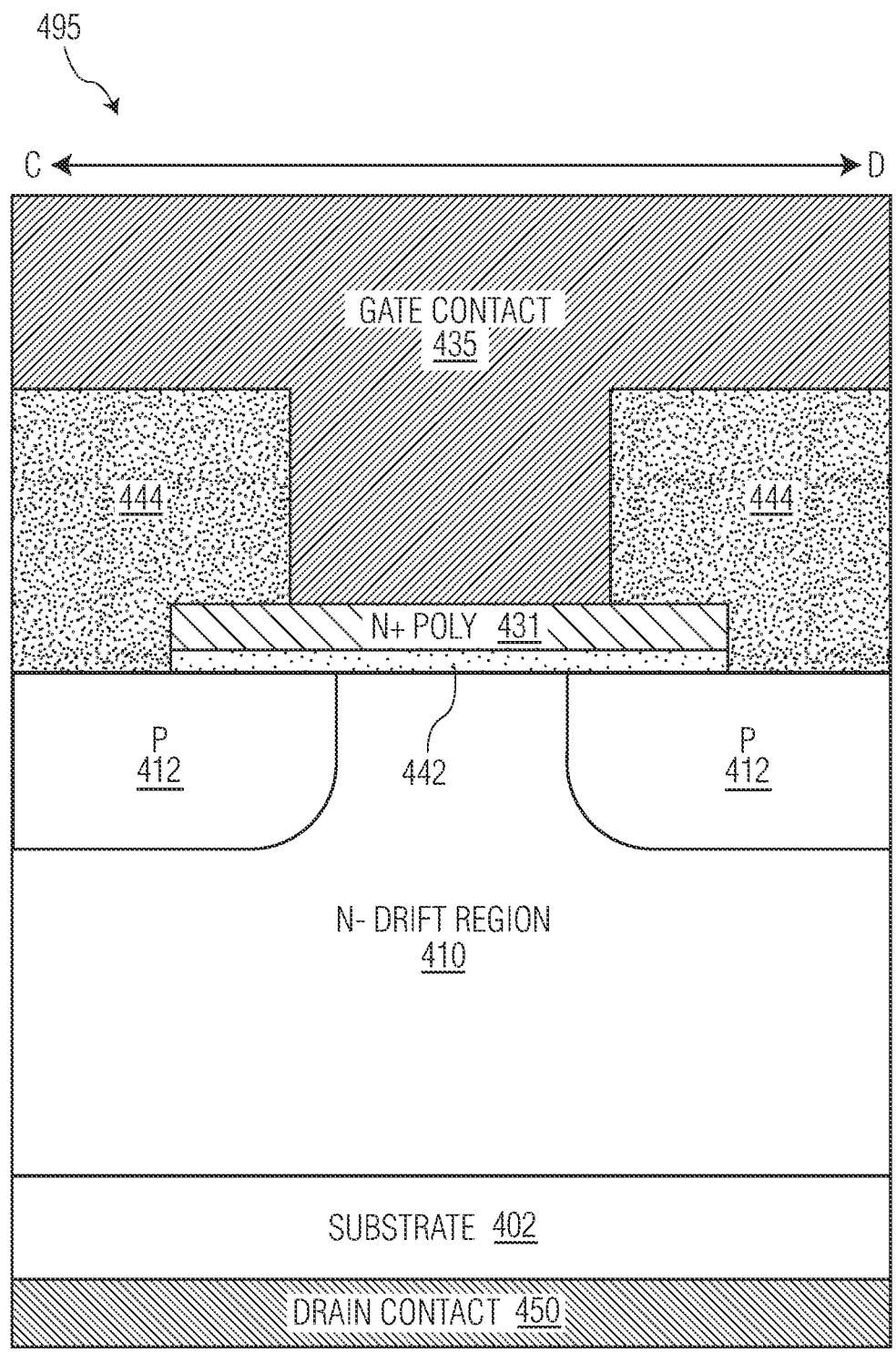
FIG. 4C is a transverse cross-sectional view across a gate finger in a gate contact area of the transistor of FIG. 4A.

FIGS. 4A, 4B, and 4C collectively depict features of an example transistor according to embodiments herein. For purposes of illustration, the transistor 400 is a vertical DMOS FET like the transistors 100, 300, but this example is not intended to limit embodiments to DMOS FETs.

FIG. 4A is a schematic plan-view of the transistor 400 formed on a substrate 402 (e.g., a substrate 102/302). The transistor 400 has a first current terminal (formed at least in part by one or more source fingers 420 as shown), a second current terminal (formed at least in part a drain contact or one or more drain fingers, not shown in FIG. 4A), and a control terminal (formed at least in part by one or more gate fingers 430). As shown, the transistor 400 may include a source contact 425 in a source contact area 490 (i.e., an area in which the source fingers 420 and gate fingers 430 are both present) that contacts one or more source fingers 420 and a gate contact 435 that contacts multiple gate fingers 430 in a gate contact area 495A (i.e., an area where the source fingers 420 are absent) through vias or other electrical contacts indicated by hatched areas underneath the gate contact 435. The transistor 400 also includes a distinct discharge contact 445 that a contacts the gate fingers 430 in a discharge contact area 497. The discharge contact 445 may be coupled to one or more external diodes such as the diode structure 470 pictured in FIG. 4B or, in or more embodiments a transistor such as the transistor 400 is modified to incorporate a second diode structure (as described below in connection with FIG. 5 and FIG. 6)

FIG. 4B is a schematic cross-sectional view of the transistor 400 in the source contact area 490 along the line A-B of FIG. 4A. Because the transistor 400 includes a distinct discharge contact 445 in the discharge contact area 497, the source contact area of the transistor 400 may be substantially similar or identical to the source contact area 190 of the transistor 100. Thus, analogously to the source contact area 190 of the transistor 100, the portion of the source contact area 490 shown has two source fingers 420 (e.g., source fingers 120) depicted as volumes of semiconductor material with n-type doping within oppositely doped p-type wells 412 (e.g., p-type wells 112). The p-type wells 112 are in turn surrounded by an n-type drift region 410 (e.g., a drift region 110) that is disposed between the p-type wells 412. In this example, the substrate 402 is an n-type wafer and a drain region is defined by the drain contact 450 on the back of the substrate 402. Gate fingers 430 (e.g., gate fingers 130/330) are disposed above the drift region 410 and are separated from the drift region 410 and the source fingers 420 by a gate dielectric 42. The drift region 110 may be formed by doping a portion of the substrate 102 or may be formed by depositing or otherwise forming additional semiconductor material on the substrate 102 (e.g., via any suitable techniques including epitaxial growth techniques). When a suitable bias voltage is applied to a gate finger 130, an electrically conductive path is formed in the channel region 145 between the source fingers 120 and the drain contact 150. The gate fingers 130 are isolated from the source contact 125 in the source contact area 190 by an interlayer dielectric 144.

Figure 4D:
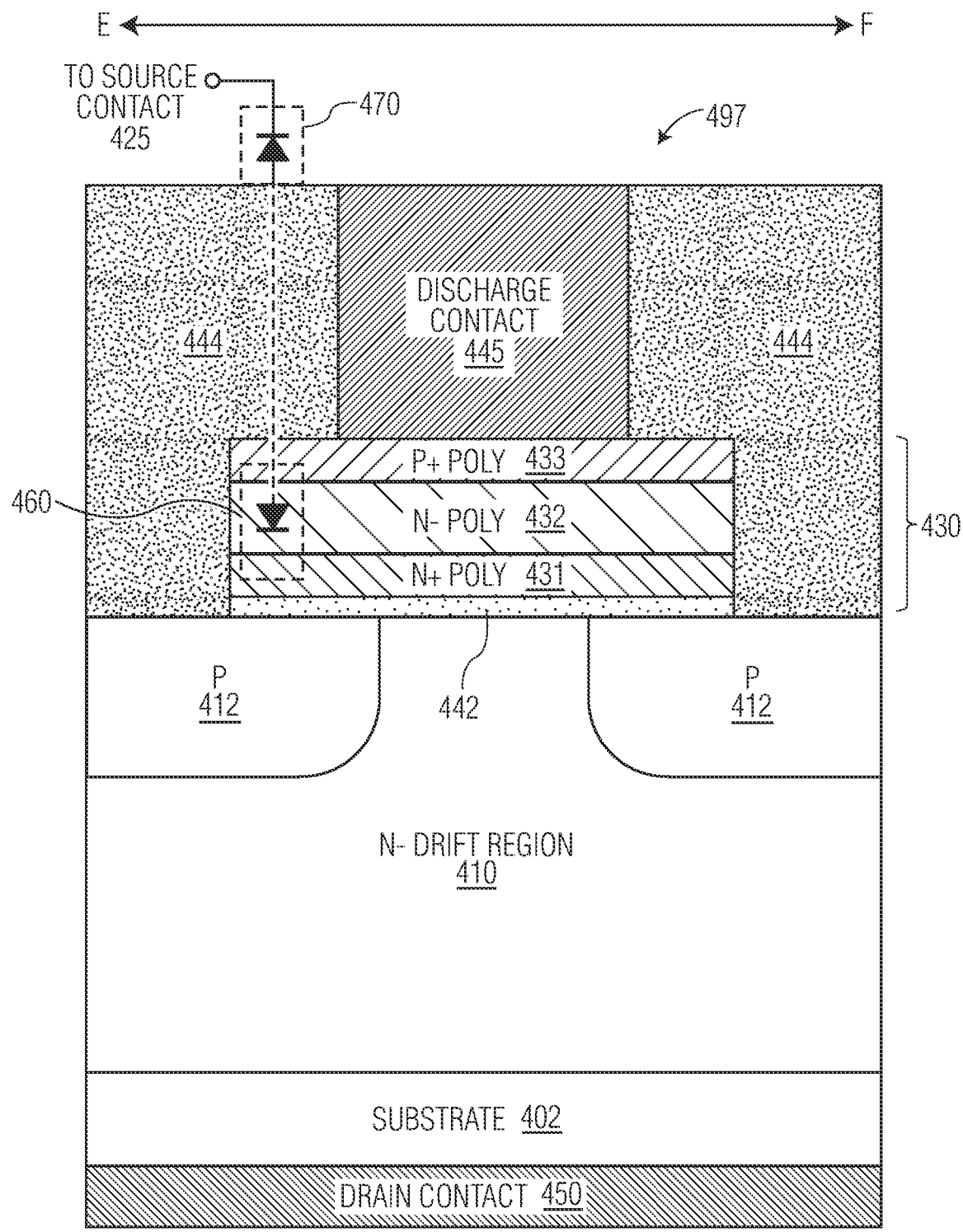
FIG. 4D is a transverse cross-sectional view across a gate finger in a discharge contact area of the transistor of FIG. 4A.

FIGS. 4C and 4D are schematic cross-sectional views of the transistor 400 in the gate contact area 495 and in the discharge contact area 497, respectively. The transistor 400 differs from the transistor 300 primarily in the presence of both a gate contact area 495 where the gate contact 435 (e.g., the gate contact 135) is present, and an additional discharge contact area 497 where a discharge contact 445 is present. In the source contact area 490, the gate fingers 430 have a similar structure to the gate fingers 330 except that they are isolated from the source contact 435 by an interlayer dielectric 444 (e.g., interlayer dielectric 144 as in source contact area 190 of the transistor 100).

FIG. 4C is a cross-sectional schematic of the transistor 400 in gate contact area 495, along the line C-D of FIG. 4A. In this view, two n-type source fingers 420 (heavily n-doped wells) are disposed within and surrounded by p-type wells 412 (e.g., p-type wells 112/312), which are in turn surrounded by an n-type drift region 410 (e.g., a drift region 110/310) disposed between the p-type wells 412. In this example, the substrate 402 is an n-type wafer and a drain region is defined by the drain contact 450 (e.g., a drain contact 150/350) on the back of the substrate 402. Gate fingers 430 with a first layer configured to function as a gate electrode are disposed above the drift region 410 at a top surface 415 of the device above the portion of the drift region 410 at the top surface 415 and separated from the drift region 410 and the source fingers 420 by a gate dielectric 442 (e.g., a gate dielectric 142/342).

FIG. 4D is a cross-sectional schematic of the transistor 400 in the discharge contact area 497 along the line E-F of FIG. 4A. The structure of the transistor 400 in the discharge contact area 497 may be substantially similar or identical to the source contact area 390 of the transistor 300 with the exception that the source contact 425 (e.g., the source contact 325) is absent as are the source fingers 420 (e.g., source fingers 320). Instead, the discharge contact 445 contacts the gate finger 430 (e.g., a gate finger 330) which includes an n+ gate finger layer 431 separated from the drift region 410 by the gate dielectric 442 (e.g., a gate dielectric 142/342) and disposed directly above the gate dielectric 442, an n-type gate finger layer 432 directly above the n+ gate finger layer 431, and a p+ gate finger layer 433 directly above the n-type finger layer 432. Together this gate finger material stack forms a diode structure 460 oriented as shown in FIG. 4D. Analogously with the transistor 300, the gate stack 330B may be substituted for the structure of the gate finger 430 in the discharge contact area 497 of the transistor 400.

Figure 4E:
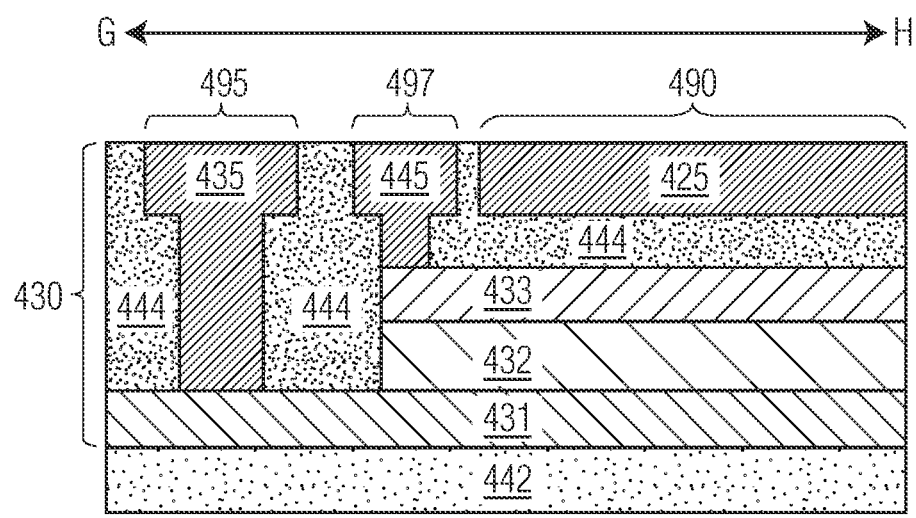
FIG. 4E is a lengthwise cross-sectional view of the transistor of FIGS. 4A-4C along a gate finger.

FIG. 4E is a lengthwise cross-sectional view of a gate finger 430 along the line G-H of FIG. 4A showing the structure of the gate finger 430. In the gate contact area 495, only the first gate finger layer (the n-type gate finger layer 431) is present. The first layer is configured for use as a gate electrode and is directly contacted by the gate contact 435. In one or more embodiments, the gate contact 435 is electrically isolated from the source contact 425 by the interlayer dielectric 444 as shown. Meanwhile, the full stack of the gate finger 430 is present in the discharge contact area 497 and the source contact area 425 in which a rectifying junction exists between the first gate finger layer (the n-type gate finger layer 431) and the top gate finger layer (the p-type gate finger layer 433). In one or more embodiments the rectifying junction includes an intermediate layer such as the n-type layer 332, while in one or more other embodiments, the rectifying junction may be abrupt or graded. The top gate finger layer (the p-type gate finger layer 433) is electrically contacted by the discharge contact 445 within the discharge contact area 497. Meanwhile, the top gate finger layer is separated from the source contact 425 in the source contact area 490 by the interlayer dielectric 444 or by another other suitable material(s) or structure(s).

As above, in one or more embodiments, the transistor 400 is implemented as a p-n-p transistor rather than the n-p-n transistor depicted in FIGS. 4B, 4C, and 4D. In such embodiments, an n+/n−/p+ gate structure (from top to bottom) may be used for the gate finger instead of the gate finger 430 or a n+/p−/p+ gate structure may be used as a gate finger instead of the gate stack 330B.

In some applications, it is desirable to apply a bias voltage to the gate in the 'off' mode of transistors described herein that is opposite in polarity to the gate bias voltage that places such transistors in the cony state (i.e., $V_{GS}>0$) when the transistor is cony and $V_{GS}<0$ when the transistor is 'off'.) However, it will be appreciated that, for the structure shown in FIG. 4D, when $V_{GS}<0$, the diode structure 460 will be forward-biased, which can result in unwanted power consumption caused by undesired forward current through the diode structure 460. Accordingly, in one or more embodiments, an external diode structure 470 oriented oppositely to the diode structure 470 can be connected in a back-to-back configuration with the diode structure 460 between the diode structure 460 and the source contact 425 as shown.

Figure 5A:
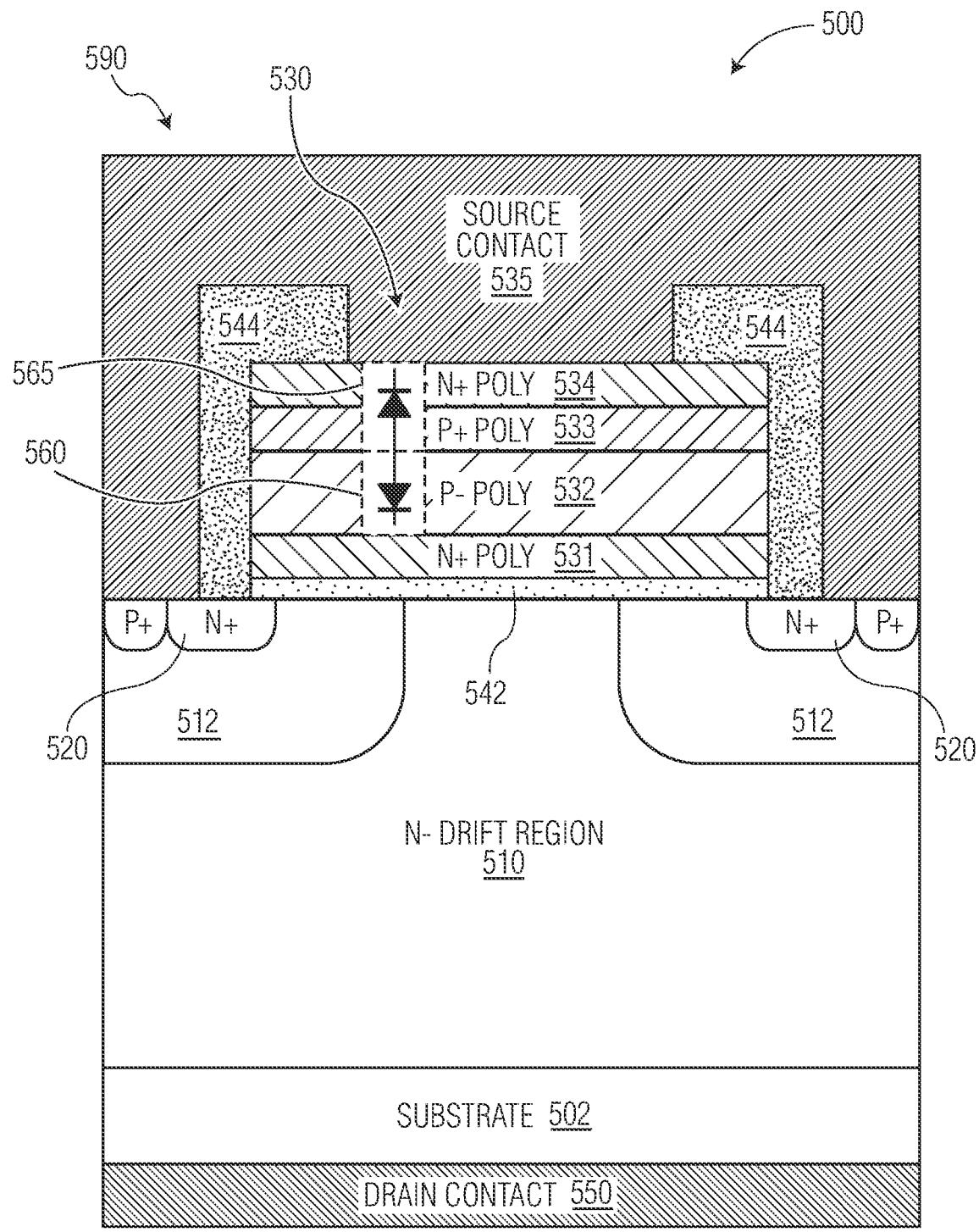
FIG. 5A is a transverse cross-sectional across two source fingers and gate finger in a source contact area of a transistor according to one or more embodiments.
Figure 5B:
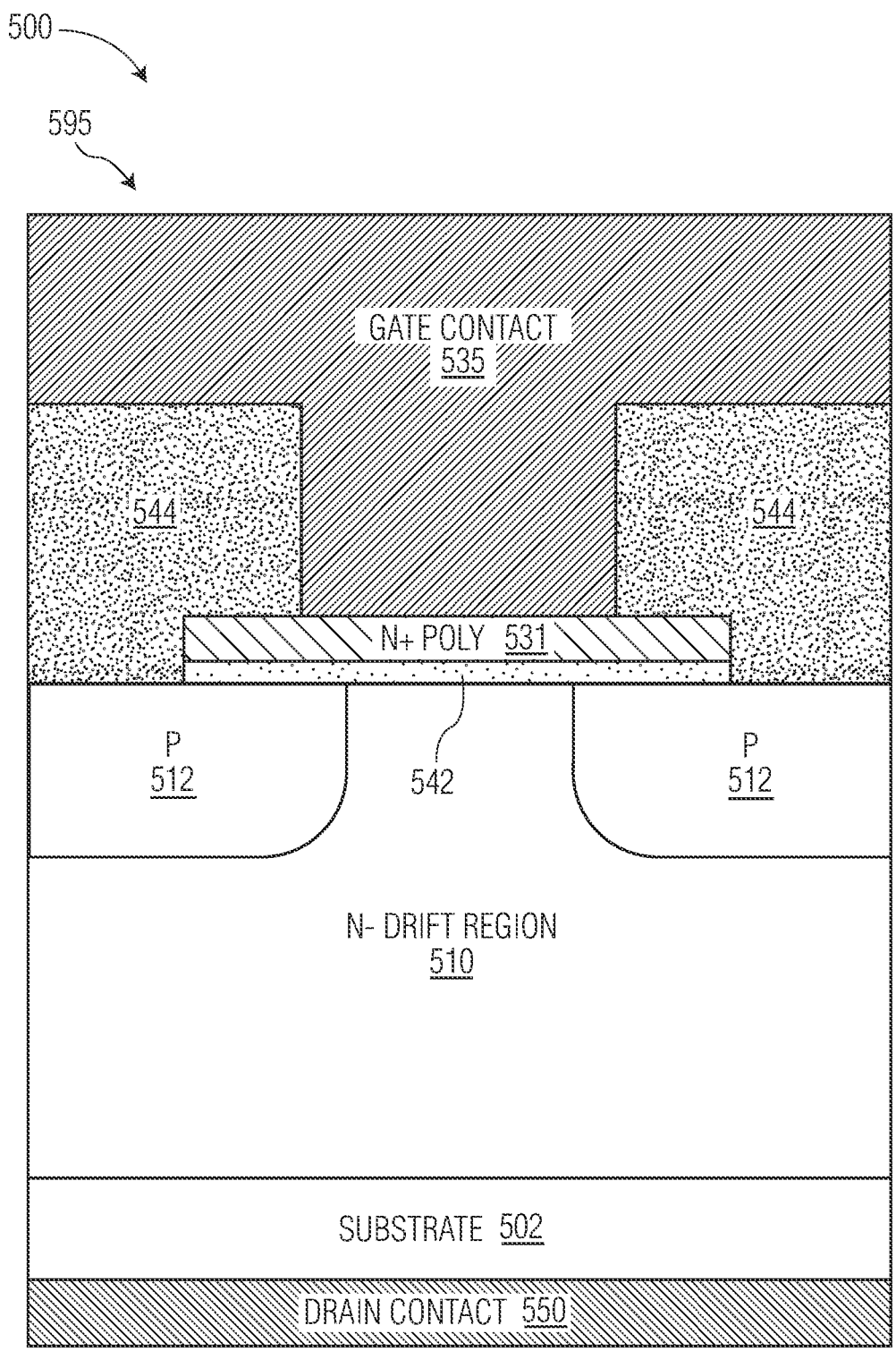
FIG. 5B is a transverse cross-sectional across a gate finger in a gate contact area of the transistor of FIG. 5A.

In one or more embodiments a back-to-back diode structure can be integrated into gate fingers or portions thereof in a transistor, as illustrated by FIG. 5A and FIG. 5B depicted an example transistor according to embodiments herein, FIG. 5A depicts a gate finger 530 in a source contact area 590 (e.g., the source contact area 390 of the transistor 300) of the transistor 500, which can be used in place of the gate finger 430 of the transistor 400 in the discharge contact area 497. The material stack of the gate finger 530, starting at the gate dielectric 542 (e.g., a gate dielectric 142/342/442), can include an n+ layer 531 followed by a p− layer 532, a p+ layer 533, and an n+ layer 534, surrounded by an interlayer dielectric 544 (e.g., an interlayer dielectric 144/344/444). Analogously to other transistors described herein the transistor 500 has gate fingers 520 (e.g., gate fingers 120/320/420) depicted as n-type wells surrounded by p-type wells 512 (e.g., p-type wells 112/312/412), an n-type drift region 510 (e.g., a drift region 110/310/410) formed above (or within a top portion of) a substrate 502 (e.g., a substrate 102/302/402) provided with a backside drain contact 550 (e.g., a drain contact 150/350/450).

FIG. 5B is a cross-sectional schematic of the transistor 500 in a gate contact area 595 (e.g., a gate contact area 395/495). The structure of the transistor 500 in the gate contact area 595 may be substantially similar or identical to the gate contact area 195/295/395 of the transistors 100/300/400. As shown, the gate contact 535 contacts the n-type layer 531 which is disposed directly above the gate dielectric 542 through an aperture in the interlayer dielectric 544.

In some applications, the presence of diode structures throughout the gate fingers of an entire source contact area (e.g., the source contact area 590 of FIG. 5A) can have undesirable performance characteristics due to additional parasitic gate capacitance introduced by the diode structures.

Figure 6A:
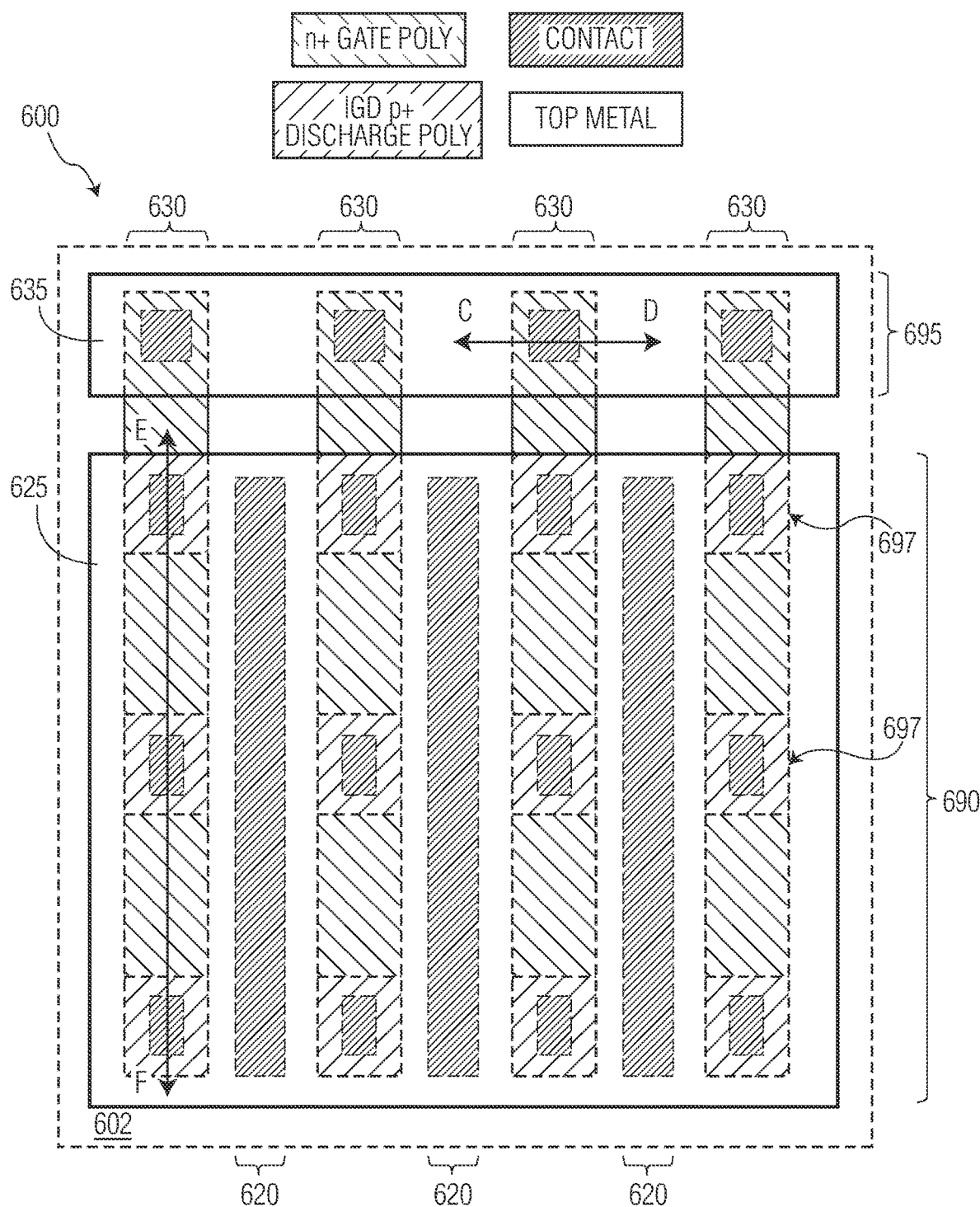
FIG. 6A is a plan view of another transistor according to embodiments herein.
Figure 6B:
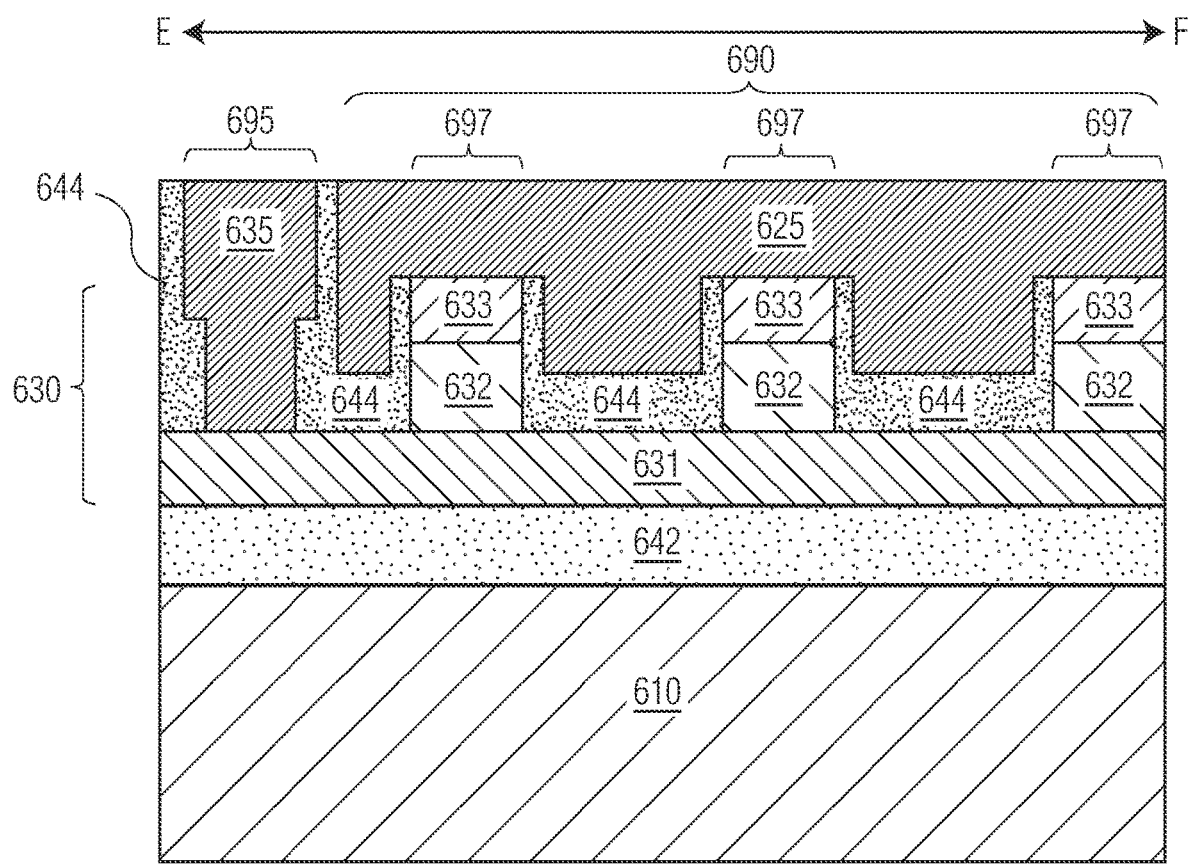
FIG. 6B is a lengthwise cross-sectional view of a gate finger of the transistor of FIG. 6A.

In one or more embodiments, this additional capacitance is reduced by forming multiple "islands" with gate discharge structures along one or more source fingers, as illustrated in FIGS. 6A and 6B, which show features of an example transistor according to such embodiments.

FIG. 6A is a plan view of a transistor 600 formed on a substrate 602 (e.g., a substrate 102/302/402/502) having source fingers 620 coupled to a source contact 625, gate fingers 630 coupled to gate contact 635. The source contact 625 is present in the source contact area 690 and the gate contact is presented in a separate gate contact area 695. As shown, the transistor 600 has discrete discharge areas 697 in the form of "islands" within each gate finger 630. These discharge areas 697 may be coupled to each other via the source contact 625 as shown in FIG. 6B.

FIG. 6B is cross-sectional view illustrating spatial relationships between various structures of the transistor 600 including the gate contact 635, the source contact 625, and three discharge areas 697. As shown, each gate finger 630 can be viewed as having three distinct areas. The first of these lies within the gate contact area 695 where the gate contact 635 electrically contacts the first layer of the gate finger 630 directly above the gate dielectric 642 (e.g., a gate dielectric 142/342/542) which is used as a gate electrode. The second area is where the source contact 625 passes above the first layer 631 of the gate finger 630 but is isolated from the first layer 631 by the interlayer dielectric 644. The third area is made up of individual discharge contact areas 697 where the source contact 625 makes direct electrical contact with the top gate finger layer (the p-type layer 633). Analogously to the stacked gate finger layers (331/332/333)/(431/432/432) or (531/532/533), the stacked gate finger layers (631/632/633) form a diode structure (e.g., a diode structure 360/460/560).

In or more embodiments, discharge areas 697 are uniform in area and/or uniformly spaced as shown in FIG. 6A and FIG. 6B. Meanwhile, in or more other embodiments, discharge areas 697 may have any suitable sizing and arrangements. For instance, in order to limit the total parasitic capacitance introduced by discharge areas 697, a limited number of discharge area 697 may be employed and/or they may be disposed preferentially at least a predetermined distance from edges of a transistor such as the transistor 600 where temperature increases due to excessive current events may be lower than near the center of the device.

In one more embodiments, the discharge areas 697 may be contacted by one or more separate contacts (e.g., a discharge contact 445) and not directly connected to the source contact 625 as shown. It will be understood that, in one or more such embodiments, multiple metal layers and insulating layers and other suitable structures may be interleaved or otherwise routed to provide distinct contacts that are not electrically shorted which may be connected to external circuit elements.

As above, in one or more embodiments, the transistor 600 is implemented as a p-n-p transistor rather than the n-p-n transistor depicted in FIGS. 6A and 6B. In such embodiments, an n+/n−/p+ gate structure (from top to bottom) may be used for the gate instead of the gate finger layers shown for the gate finger 630 or an n+/p−/p+ gate structure may be used.

Figure 7A:
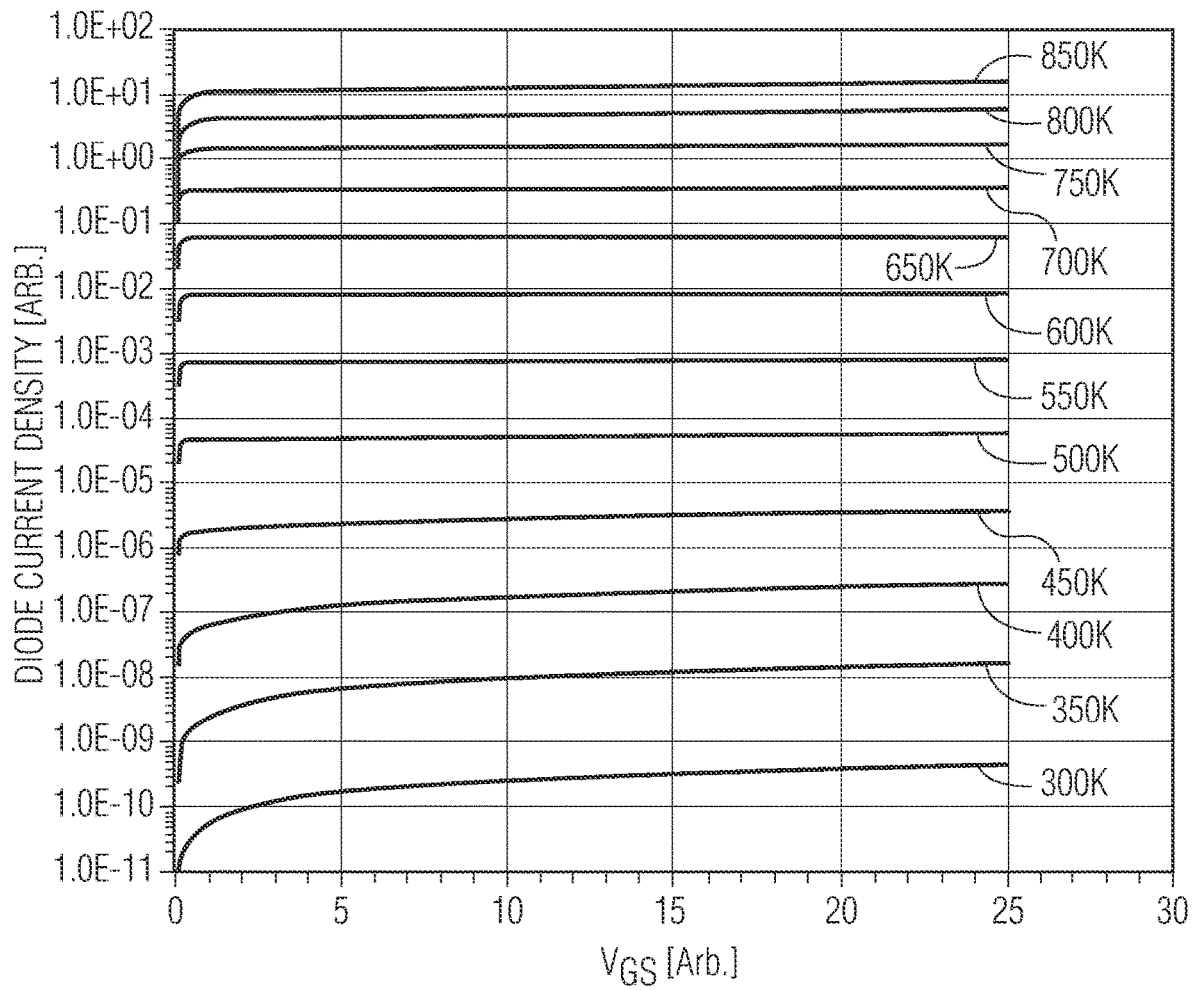
FIG. 7A is graph showing simulated transfer characteristics of diode structures relating gate bias voltages to current densities in those diode structures according to embodiments herein at different temperatures.

FIG. 7A is a plot illustrating voltage-current transfer characteristics of diode structures according to embodiments herein (e.g., the diode structure 360 formed by the layers 331, 332, and 333 of FIG. 3B, the diode structure 460 formed by the layers 431, 432, and 433 of FIG. 4D, and/or the diode structure 560 of FIG. 5A) as a function of the applied gate bias, $V_{GS}$. It will be appreciated that the reverse diode current density varies by approximately twelve orders of magnitude when the temperature is varied from 300 K to 850 K. It is this leakage current which results in the reduction of the effective gate bias applied to the gate of transistors according to embodiments herein. When a transistor having a channel formed from silicon carbide is combined with a gate having polysilicon diode structures such as those described herein, these structures become effective temperature-sensitive current-limiting devices. It will be further understood that nothing herein is intended to limit embodiments to silicon carbide transistors with polysilicon diode structures. Rather, a transistor channel implemented in any particular material may be combined with diode structures formed from any other material with a suitably different temperature response (e.g., diode structures formed for materials characterized by a smaller bandgap energy than a bandgap energy of the material forming the active areas of the device).

Figure 7B:
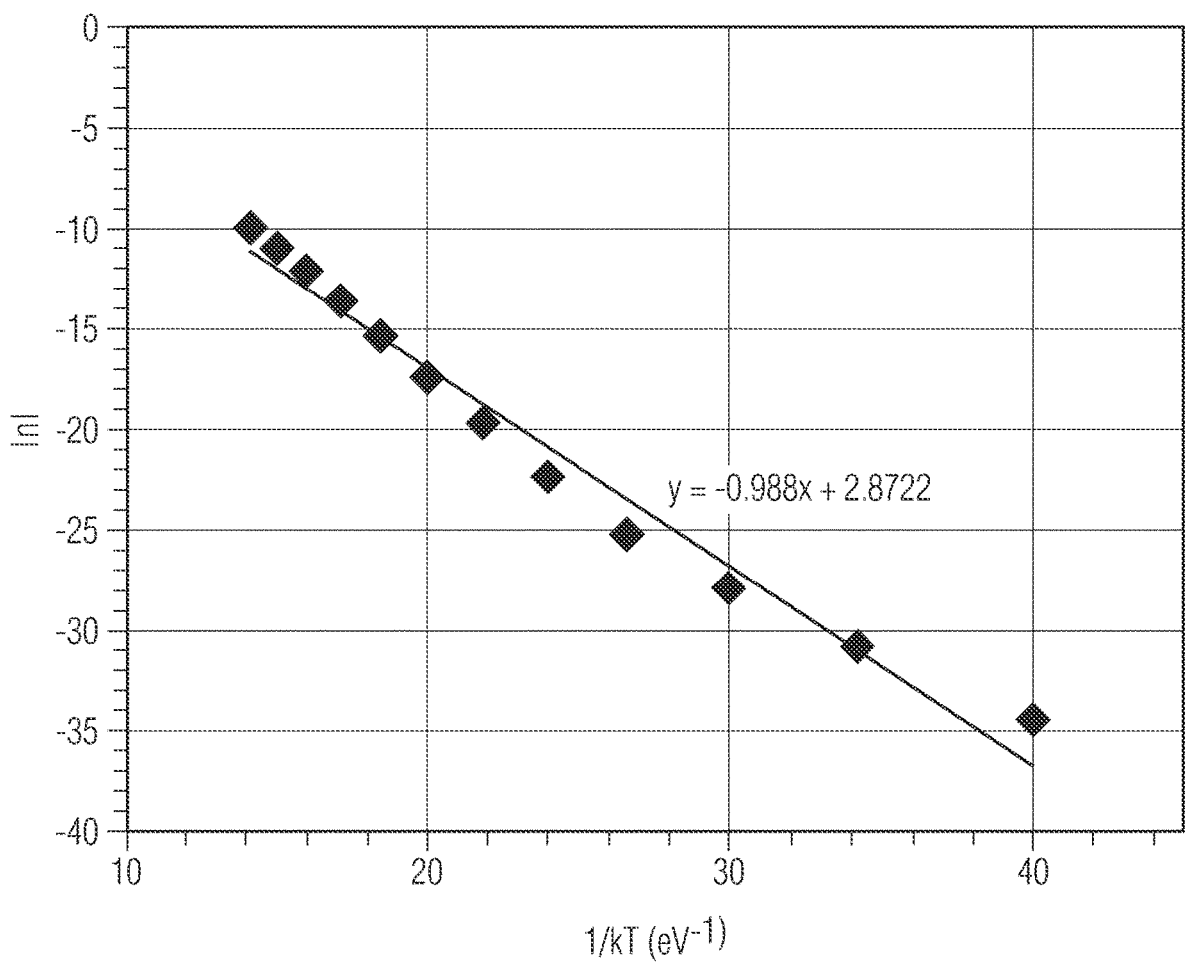
FIG. 7B is graph showing a logarithmic relationship between current density and temperature in a simulated diode structure.

FIG. 7B is a logarithmic plot illustrating the temperature dependence of the reverse leakage current in a simulated diode structure that is representative of the diode structures described in connection with embodiments herein at fixed value of the applied gate bias $V_{GS}$. The approximately linear trend line indicates that the relationship between increasing temperature and the reverse current magnitude is approximately an exponential function that depends on the activation energy ($E_a$) and the thermal energy $k_s$, where $k_B$ is Boltzmann's constant and T is the temperature in Kelvins (i.e., the reverse current is approximately proportional to $$e^{-\left(\frac{E_a}{k_B T}\right)}.$$

This relationship accounts for the ability of diode structures according to embodiments herein to rapidly reduce the effective gate bias in transistors when the channel temperature increases due to a short circuit or other excess current event.

Features of embodiments may be understood by way of one or more of the following examples:

Example 1: a semiconductor device or method for forming the same includes a device having a first current terminal, a second current terminal, a control terminal, and a temperature-sensitive current-limiting device. The first and second current terminals and the control terminal are jointly configured to provide an electrically conductive current path from the first current terminal to the second current terminal via a channel region when a suitable bias voltage of a first polarity is applied to the control terminal. The temperature-sensitive current-limiting device is integrally formed from semiconductor material of the control terminal and the current-limiting device is configured to cause a reduction in an amount of electrical current flowing from the first current terminal to the second current terminal when a temperature of the device within the channel region exceeds a predetermined temperature limit.

Example 2: The device or method of Example 1, where the channel region is formed from a first semiconductor material characterized by a first semiconductor bandgap energy and the current-limiting device is formed from a second semiconductor material that is characterized by a second semiconductor bandgap energy that is smaller than the first semiconductor bandgap energy. When the temperature within the channel region exceeds the predetermined temperature limit, the current-limiting device is configured such that an electrical current passing through the current-limiting device causes an effective electrical potential of the channel region to be reduced.

Example 3: The device or method of Example 1 or Example 2, in which the current-limiting device includes first diode structures integrally formed from semiconductor material of the control terminal that are configured to be reverse-biased when a bias voltage having the first polarity is applied to the control terminal. The current-limiting device is in electrical contact with the control terminal and the first current terminal.

Example 4: The device or method of any of Examples 1-3, in which the control terminal includes a dielectric material disposed above the channel region and an elongated gate finger. The gate finger includes a first gate finger layer disposed above the channel region that is capacitively coupled to the channel region and configured as a gate electrode; a second gate finger layer disposed above the first gate finger layer; and an electrically-rectifying junction between the first gate finger layer and the second gate finger layer.

The first gate finger layer is further configured such that when the suitable bias voltage is applied to the control terminal, an electrical potential of the of the first gate finger layer is sufficient to form at least a portion of the electrically-conductive current path from the first current terminal to the second current terminal via the channel region.

Example 5: The device or method of Examples 4 in which the current-limiting device includes the first gate finger layer and the second gate finger layer. The first gate finger layer is formed from a first semiconducting volume that has a first electrical conductivity type and the second gate finger layer is formed from a second semiconducting volume having a second electrical conductivity type that is opposite the first electrical conductivity type.

Example 6: The device or method of any of Examples 4-5, in which the second gate finger layer comprises at least a first portion disposed above the first gate finger layer and a second portion disposed above the first gate finger layer that is physically separated from the first portion of the second gate finger layer. The electrically-rectifying junction between the first gate finger layer and the second gate finger layer includes: an electrically-rectifying junction between the first gate finger layer and the first portion of the second gate finger layer; and an electrically-rectifying junction between the first gate finger layer and the second portion of the second gate finger layer.

Example 7: The device or method of Example 6, in which the first portion of the second gate finger layer and the second portion of the second gate finger layer are electrically coupled to each other by an electrical contact layer.

Example 8: The device or method of any of Examples 3-7, in which the current-limiting device also includes second diode structures disposed between the first diode structures and the first current terminal. The second diode structures are configured to be reverse biased when the first diode structures are forward biased.

Example 9: The device or method of Example 8, wherein the second diode structures disposed between the first diode structures and the first current terminal are also integrally formed within semiconductor material of the control terminal.

Example 10: a transistor or method of forming the same includes a transistor having a first current terminal; a second current terminal; a control terminal; elongated semiconducting source fingers coupled to the first current terminal; and elongated gate fingers in an interdigitated arrangement with the source fingers that are coupled to the control terminal. Each source finger includes a volume of a first semiconductor material doped to have a first electrical conductivity type and disposed within a surrounding volume of the first semiconductor material doped to have a second electrical conductivity type opposite the first electrical conductivity type. Each gate finger comprising an electrically conductive first gate finger layer;

The first gate finger layer is disposed between two source fingers above the surrounding volumes of the first semiconductor material of those source fingers and above a drift region formed from the first semiconductor material doped to have the first electrical conductivity type and disposed between the surrounding volumes of the first semiconductor material of the two source fingers.

The first gate finger layer is separated from first semiconductor material of the surrounding volumes of the first semiconductor material and from the drift region by a first dielectric material; and the first gate finger layer is configured such that, when a first bias voltage having a first polarity is applied to the control terminal, an electrically conductive channel region is formed between the source fingers and the drain contact via the drift region.

Each gate finger includes a temperature-sensitive current-limiting device integrally formed from a second semiconductor material characterized by a semiconductor bandgap energy that is smaller than a semiconductor bandgap energy of the first semiconductor material. The current-limiting device of each gate finger is configured to cause a reduction in an amount of electrical current flowing from the first current terminal to the second current terminal when a temperature of the transistor within the channel region exceeds a predetermined temperature limit.

Example 11: The device or method of Example 10, in which the current-liming device of each gate finger includes an electrically-rectifying structure formed by the second semiconductor material connected between the first gate layer and the first current terminal that is configured to be reverse-biased when the transistor is biased in an cony state.

Example 12: The device or method of Example 11, in which each gate finger includes a first portion where the electrically-rectifying structure is absent and the first gate finger layer is directly connected to the control terminal; and a second portion where the electrically rectifying structure is connected between the first gate finger layer and the first current terminal.

Example 13: The device or method of Example 12, in which each gate finger also includes a third portion where the electrically rectifying structure is absent and the source contact is disposed above the first gate finger layer and separated from the first gate finger layer by a second dielectric material.

Example 14: The device or method of any of Examples 10-13, where each gate finger includes multiple second portions where the electrically rectifying structure is connected between the first gate finger layer and the first current terminal; and multiple third portions where the electrically rectifying structure is absent and the source contact is disposed above the first gate finger layer and separated from the first gate finger layer by the second dielectric material. The multiple second portions are separated from each other by the multiple third portions.

Example 15: The device or method of any of Examples 10-14, where each gate finger further includes: a first portion where the electrically-rectifying structure is absent and the first gate finger layer is directly connected to the control terminal; a second portion where the electrically rectifying structure is connected between the first gate finger layer and a discharge terminal contact; and a third portion where a source contact coupled to the first current terminal is disposed above the electrically rectifying structure and separated from the electrically rectifying structure by a second dielectric material.

Example 16: The device or method of any of Examples 10-15, where the electrically-rectifying element is a first electrically rectifying element. This Example also include some or more additional electrically rectifying structures connected between the discharge terminal contact and the source contact. The additional electrically-rectifying elements are configured such that they are reverse biased when first electrically-rectifying element of each gate finger is forward biased.

It should be understood embodiments are not limited in their application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A semiconductor device comprising:
   a first current terminal, a second current terminal, and a control terminal jointly configured to provide an electrically conductive current path from the first current terminal to the second current terminal via a channel region when a suitable bias voltage of a first polarity is applied to the control terminal; and
   a temperature-sensitive current-limiting device integrally formed from semiconductor material of the control terminal, wherein the current-limiting device is configured to cause a reduction in an amount of electrical current flowing from the first current terminal to the second current terminal when a temperature of the device within the channel region exceeds a predetermined temperature limit.

2. The semiconductor device of claim 1,
   wherein the channel region is formed from a first semiconductor material characterized by a first semiconductor bandgap energy; and
   wherein the current-limiting device is formed from a second semiconductor material that is characterized by a second semiconductor bandgap energy that is smaller than the first semiconductor bandgap energy; and
   wherein, when the temperature within the channel region exceeds the predetermined temperature limit, the current-limiting device is configured such that an electrical current passing through the current-limiting device causes an effective electrical potential of the channel region to be reduced.

3. The semiconductor device of claim 1,
   wherein the current-limiting device comprises first diode structures integrally formed from semiconductor material of the control terminal that is configured to be reverse-biased when a bias voltage having the first polarity is applied to the control terminal; and
   wherein the current-limiting device is in electrical contact with the control terminal and the first current terminal.

4. The semiconductor device of claim 3, wherein the control terminal comprises:
   a dielectric material disposed above the channel region; and
   an elongated gate finger comprising:
   a first gate finger layer disposed above the channel region that is capacitively coupled to the channel region and configured as a gate electrode;
   a second gate finger layer disposed above the first gate finger layer; and
   an electrically-rectifying junction between the first gate finger layer and the second gate finger layer; and
   wherein the first gate finger layer is further configured such that when the suitable bias voltage is applied to the control terminal, an electrical potential of the of the first gate finger layer is sufficient to form at least a portion of the electrically conductive current path from the first current terminal to the second current terminal via the channel region.

5. The semiconductor device of claim 4,
wherein the current-limiting device comprises the first gate finger layer and the second gate finger layer; and
wherein the first gate finger layer is formed from a first semiconducting volume that has a first electrical conductivity type and the second gate finger layer is formed from a second semiconducting volume having a second electrical conductivity type that is opposite the first electrical conductivity type.

6. The semiconductor device of claim 5,
wherein the second gate finger layer comprises at least a first portion disposed above the first gate finger layer and a second portion disposed above the first gate finger layer that is physically separated from the first portion of the second gate finger layer; and:
wherein the electrically-rectifying junction between the first gate finger layer and the second gate finger layer includes:
an electrically-rectifying junction between the first gate finger layer and the first portion of the second gate finger layer; and
an electrically-rectifying junction between the first gate finger layer and the second portion of the second gate finger layer.

7. The semiconductor device of claim 6, wherein the first portion of the second gate finger layer and the second portion of the second gate finger layer are electrically coupled to each other by an electrical contact layer.

8. The semiconductor device of claim 3,
wherein the current-limiting device further comprises second diode structures disposed between the first diode structures and the first current terminal; and
wherein the second diode structures are configured to be reverse biased when the first diode structures are forward biased.

9. The semiconductor device of claim 8, wherein the second diode structures disposed between the first diode structures and the first current terminal are also integrally formed within semiconductor material of the control terminal.

10. A transistor comprising:
a first current terminal operable as a source terminal of the transistor;
a second current terminal operable as a drain terminal of the transistor;
a control terminal;
elongated semiconducting source fingers coupled to the first current terminal, each source finger comprising a volume of a first semiconductor material doped to have a first electrical conductivity type and disposed within a surrounding volume of the first semiconductor material doped to have a second electrical conductivity type opposite the first electrical conductivity type; and
elongated gate fingers in an interdigitated arrangement with the source fingers and coupled to the control terminal, each gate finger comprising an electrically conductive first gate finger layer;
wherein the first gate finger layer is disposed between two source fingers above the surrounding volumes of the first semiconductor material of those source fingers and above a drift region formed from the first semiconductor material doped to have the first electrical conductivity type and disposed between the surrounding volumes of the first semiconductor material of the two source fingers;
wherein the first gate finger layer is separated from the surrounding volumes of the first semiconductor material and from the drift region by a first dielectric material; and
wherein the first gate finger layer is configured such that, when a first bias voltage having a first polarity is applied to the control terminal, an electrically conductive channel region is formed between the source fingers and a drain contact coupled to the second current terminal via the drift region;
wherein each gate finger further comprises a temperature-sensitive current-limiting device that is integrally formed within that gate finger from a second semiconductor material; and
wherein the temperature-sensitive current-limiting device of each gate finger is configured to cause a reduction in an amount of electrical current flowing from the first current terminal to the second current terminal when a temperature of the transistor within the channel region exceeds a predetermined temperature limit.

11. The transistor of claim 10,
wherein the second semiconductor material is characterized by a semiconductor bandgap energy that is smaller than a semiconductor bandgap energy of the first semiconductor material; and
wherein the temperature-sensitive current-limiting device of each gate finger is formed from the second semiconductor material.

12. The transistor of claim 11, wherein the temperature-sensitive current-liming device of each gate finger comprises an electrically-rectifying structure formed by the second semiconductor material connected between the first gate finger layer and the first current terminal that is configured to be reverse-biased when the transistor is biased in an 'on' state.

13. The transistor of claim 12, wherein each gate finger further comprises:
a first portion where the electrically-rectifying structure is absent and the first gate finger layer is directly connected to the control terminal; and
a second portion where the electrically-rectifying structure is connected between the first gate finger layer and the first current terminal.

14. The transistor of claim 12, wherein each gate finger further comprises:
a third portion where the electrically-rectifying structure is absent and a source contact coupled to the first current terminal is disposed above the first gate finger layer and separated from the first gate finger layer by a second dielectric material.

15. The transistor of claim 14, wherein each gate finger further comprises:
multiple second portions where the electrically-rectifying structure is connected between the first gate finger layer and the first current terminal; and
multiple third portions where the electrically-rectifying structure is absent and the source contact is disposed above the first gate finger layer and separated from the first gate finger layer by the second dielectric material; and
wherein the multiple second portions are separated from each other by the multiple third portions.

16. The transistor of claim 12, wherein each gate finger further comprises:
a first portion where the electrically-rectifying structure is absent and the first gate finger layer is directly connected to the control terminal;

a second portion where the electrically-rectifying structure is connected between the first gate finger layer and a discharge terminal contact; and a third portion where a source contact coupled to the first current terminal is disposed above the electrically-rectifying structure and separated from the electrically-rectifying structure by a second dielectric material.

17. The transistor of claim 16, wherein the electrically-rectifying structure is a first electrically-rectifying structure; and wherein the transistor further comprises:

one or more additional electrically-rectifying structures connected between the discharge terminal contact and the source contact; and wherein the additional electrically-rectifying structures are configured such that they are reverse biased when the first electrically-rectifying structure of each gate finger is forward biased.

* * * * *